United States Patent [19]

Fant et al.

[11] Patent Number: 5,896,541

[45] Date of Patent: Apr. 20, 1999

[54] NULL CONVENTION REGISTER FILE

[75] Inventors: Karl M. Fant, Minneapolis; Larry L. Kinney, Fridly, both of Minn.

[73] Assignee: Theseus Logic, Inc., St. Paul, Minn.

[21] Appl. No.: 08/458,139

[22] Filed: Jun. 2, 1995

Related U.S. Application Data

[60] Division of application No. 08/424,865, Apr. 18, 1995, Pat. No. 5,796,962, and a continuation-in-part of application No. 08/296,809, Aug. 26, 1994, Pat. No. 5,572,732, which is a continuation of application No. 07/837,641, Feb. 14, 1992, Pat. No. 5,355,496, said application No. 08/424,865, is a continuation-in-part of application No. 08/368,811, Jan. 6, 1995, abandoned, which is a continuation-in-part of application No. 08/318,510, Oct. 10, 1994, Pat. No. 5,664,211, which is a continuation-in-part of application No. 08/220,636, Mar. 31, 1994, Pat. No. 5,664,212, which is a continuation of application No. 08/074,288, Jun. 8, 1993, Pat. No. 5,305,463, which is a continuation of application No. 07/702,016, May 17, 1991, abandoned.

[51] Int. Cl.$^6$ .................................................. G06F 15/82
[52] U.S. Cl. ............................ 395/800.18; 395/800.25; 326/56; 326/59; 711/104; 365/168
[58] Field of Search .............................. 395/425, 800, 395/375, 820, 200.83, 832, 820.18, 820.25; 364/270.8, 950.1; 326/56, 59; 711/104; 365/168

[56] References Cited

U.S. PATENT DOCUMENTS

| | | | |
|---|---|---|---|
| 3,715,603 | 2/1973 | Lerch | 19/42 |
| 3,735,056 | 5/1973 | Martin et al. | 179/170 |
| 4,133,044 | 1/1979 | Gariazzo et al. | 365/78 |
| 4,593,281 | 6/1986 | Lare | 340/825.5 |
| 4,680,701 | 7/1987 | Cochran | 364/200 |
| 4,845,633 | 7/1989 | Furtek | 364/490 |
| 4,933,909 | 6/1990 | Cushing et al. | 365/230.05 |
| 4,961,192 | 10/1990 | Grimes | 371/37.1 |
| 5,107,462 | 4/1992 | Grundmann et al. | 365/189.02 |
| 5,121,003 | 6/1992 | Williams | 307/452 |
| 5,257,214 | 10/1993 | Mason et al. | 364/736.5 |
| 5,280,597 | 1/1994 | Takata et al. | 395/425 |
| 5,305,463 | 4/1994 | Fant et al. | 395/800 |
| 5,355,496 | 10/1994 | Fant et al. | 395/700 |
| 5,382,844 | 1/1995 | Knauer | 19/20 |
| 5,549,342 | 8/1996 | Dean | 395/446 |

FOREIGN PATENT DOCUMENTS

| | | |
|---|---|---|
| 0 566 739 A1 | 10/1993 | European Pat. Off. . |
| 0 570 584 A1 | 11/1993 | European Pat. Off. . |
| 0 578 821 A1 | 1/1994 | European Pat. Off. . |
| WO 92/12498 | 7/1992 | WIPO . |
| WO 92/16971 | 10/1992 | WIPO . |
| WO 94/03929 | 2/1994 | WIPO . |

OTHER PUBLICATIONS

M.R. Greenstreet, T.E. Williams, and J. Staunstrup, Self-Timed Iteration, Elsevier Science Publishers B.V. (North-Holland), IFIP, 1988, pp. 309–322.

Teresa H.-Y. Meng, Robert W. Brodersen, and David G. Messerschmitt, Automatic Synthesis of Asynchronous Circuits from High-Level Specifications, IEEE Transactions on Computer-Aided Design, vol. 8, No. 11, Nov. 1989, pp. 1185–1205.

Ted Williams, Latency and Throughput Tradeoffs in Self-Timed Speed-Independent Pipelines and Rings, Stanford University Technical Report No. CSL-TR-91-482, May 1991.

Jens Sparso and Jorgen Staunstrup, Delay-insensitive multi-ring structures, Integration, the VLSI Journal 15, 1993, Elsevier Science Publishers B.V., pp. 313–340.

Tzyh-Yung Wuu and Sarma B.K. Vrudhula, A Design of a Fast and Area Efficient Multi-Input Muller C-element, IEEE Transactions on VLSI Systems, vol. 1, No. 2, Jun. 1993, pp. 215–219.

Marc Renaudin and Bachar El Hassan, The Design of Fast Asynchronous Adder Structures and Their Implementation Using D.C.V.S. Logic, Int'l. Symposium on Circuits & Systems, vol. 4, 1994, pp. 291–294.

Richard G. Burford, Xingcha Fan and Neil W. Bergmann, An 180 Mhz 16 bit Multiplier Using Asynchronous Logic Design Techniques, IEEE 1994 Custom Integrated Circuits Conference, pp. 215–218.

Ted Williams, Self-Timed Rings and Their Application to Division, Stanford University Technical Report No. CSL-TR-91-482, May 1991.

David E. Muller, Asynchronous Logics and Application to Information Processing, Stanford University Press, Switching Theory In Space Technology, pp. 289–297, 1963.

Narinder Pal Singh, A Design Methodology For Self–Timed Systems, Massachusetts Institute of Technology, MIT/LCS/TR–258, Feb. 1981.

T.S. Anatharaman, A Delay Insensitive Regular Expression Recognizer, Dept. of Computer Science, Carnegie–Mellon University, CMU–CS–89–109, Jan. 1989.

Jens Sparso, et al., Design of Delay Insensitive Circuits Using Multi–Ring Structures, European Design Automation Conference, IEEE 0–8186–2780, pp. 15–20, Aug. 1992.

Lawrence G. Heller, et al., Cascode Voltage Switch Logic: A Different CMOS Logic Family, ISSCC 84 Digest of Technical Papers, IEEE, pp. 16–17, Feb. 1984.

Lars S. Nielsen and Jens Sparso, A Low–Power Asynchronous Data–Path For a FIR Filter Bank, IEEE 0–8186–7298–6/96, pp. 197–207, Jun. 1996.

Stephen H. Unger, Asynchronous Sequential Switching Circuits, 1969, pp. 221–229.

Carver Mead & Lyn Conway, Introduction to VLSI Systems, 1980, pp. 242–262.

Ivan E. Sutherland, Micropipelines, Communications of the ACM, Dec. 1989, vol. 32, No. 6.

Tadashi Shibata & Tadahiro Ohmi, A Functional MOS Transistor Featuring Gate–Level Weighted Sum and Threshold Operations, IEEE Transactions On Electron Devices, Dec. 1992, vol. 39, No. 6, pp. 1444–1455.

Anthony S. Wojcik & Kwang–Ya Fang, On The Design Of Three–Valued Asynchronous Modules, IEEE Transactions On Computers, Oct. 1980, vol. C–29, No. 10, pp. 889–989.

Mark Edward Dean, Strip: A Self–Time Risc Processor, Stanford University Computer Systems Laboratory Technical Report No. CSL–TR–92–543, Stanford, CA, Jul. 1992.

Daniel Hampel & Robert Winder, Threshold Logic, IEEE Spectrum, May 1971, pp. 32–39.

Janusz A. Brzozowski & Carl–Johan H. Seger, Asynchronous Circuits—Monographs in Computer Science, Springer–Verlag New York, Inc., 1995, New York, NY.

Brunvand, "The NSP Processor," IEEE, 1993, pp. 428–435.

Patel et al., "Evaluation of Self–Timed Systems for VLSI," Electronics Letters, Feb. 1989, pp. 215–217.

*Primary Examiner*—Larry D. Donaghue
*Assistant Examiner*—John Follansbee
*Attorney, Agent, or Firm*—Steptoe & Johnson LLP

[57] ABSTRACT

A NULL convention logic bus includes: a plurality of bus transmission lines; a plurality of NULL convention transmitter ports; and a plurality of NULL convention receiver ports. Each NULL convention transmitter port propagates alternating wavefronts of data an NULL across the bus transmission lines to a NULL convention receiver port. A pipeline bus includes NULL convention storage registers at the transmitter ports. A FIFO pipeline bus includes NULL convention storage registers at the receiver ports. A NULL convention register file includes: a NULL convention input register; and a plurality of NULL convention storage registers. The input register synchronously propagates alternating wavefronts of NULL and data to an addressed NULL convention storage register.

22 Claims, 36 Drawing Sheets

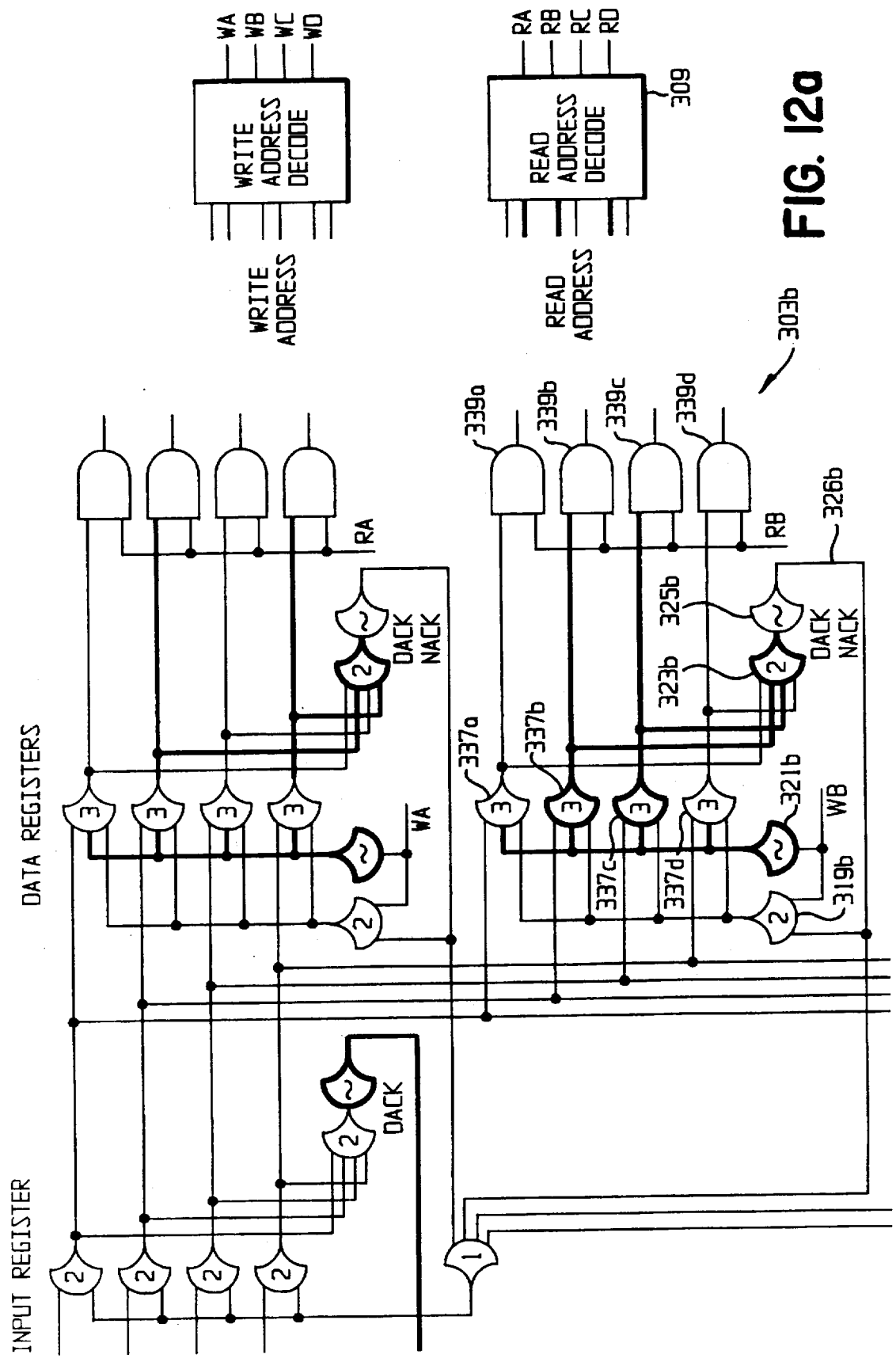

NULL CONVENTION REGISTER FILE

This is a division of U.S. patent application Ser. No. 08/424,865 filed Apr. 18, 1995, now U.S. Pat. No. 5,796,962 which is a continuation in part of U.S. patent application Ser. No. 08/368,811 filed Jan. 6, 1995, now abandoned; which is a continuation-in-part of U.S. patent application Ser. No. 08/318,510 filed Oct. 10, 1994, now U.S. Pat. No. 5,664,211; which is a continuation-in-part of U.S. patent application Ser. No. 08/220,636 filed Mar. 31, 1994, now U.S. Pat. No. 5,664,212; which is a continuation of U.S. patent application Ser. No. 08/074,288 filed Jun. 8, 1993, now U.S. Pat. No. 5,305,463; which was a continuation of U.S. patent application Ser. No. 07/702,016, abandoned, all of which are incorporated here by reference. This is also a continuation in part of U.S. patent application Ser. No. 08/296,809 filed Aug. 26, 1994, now U.S. Pat. No. 5,572,732 which is a continuation of U.S. patent application Ser. No. 07/837,641 filed Feb. 14, 1992, now U.S. Pat. No. 5,355,496.

BACKGROUND

The emergence of a new, asynchronous, non-boolean logic family presents new problems for system architectures and circuit structures.

SUMMARY

An object of this invention is to provide a data bus for NULL convention logic circuits.

A further object of this invention is to provide a register file for a NULL convention logic circuits.

These and other objects are obtained by providing a NULL convention logic bus which includes: a plurality of bus transmission lines; a plurality of NULL convention transmitter ports; and a plurality of NULL convention receiver ports. Each NULL convention transmitter port propagates alternating wavefronts of data an NULL across the bus transmission lines to a NULL convention receiver port. A pipeline bus is also provided which includes NULL convention storage registers at the transmitter ports. A FIFO pipeline bus is also provided which includes NULL convention storage registers at the receiver ports. A NULL convention register file is also provided which includes: a NULL convention input register; and a plurality of NULL convention storage registers. The input register synchronously propagates alternating wavefronts of NULL and data to an addressed NULL convention storage register.

BRIEF DESCRIPTION OF THE DRAWINGS

The invention will be described below with reference to attached drawings in which:

FIGS. 12a–12c illustrate a read sequence for elements of the register file of FIG. 10;

DETAILED DESCRIPTION OF THE PREFERRED EMBODIMENTS

The NULL convention circuitry and system architectures described here use NULL convention logic. Theory of operation of NULL convention circuits, details for gate implementations, and operation of an asynchronous register are described in U.S. Pat. No. 5,305,463, co-pending U.S. patent application ser. No. 08/368,811 and co-pending U.S. patent application Ser. No. 08/318,508 which are incorporated here by reference. For convenience, certain aspects are repeated here.

A NULL convention combinational circuit generates a result value set in response to an input value set. An important aspect of NULL convention circuits is that any particular input may have a meaningful (DATA) value or a NULL value which has no meaning. The very presence of a non-NULL value indicates that the value has meaning, and no external clock is required to indicate that a value is meaningful.

NULL convention differs from traditional boolean logic where each signal line may have one of two meaningful states. In traditional boolean logic that uses a CMOS or TTL implementation, a low voltage level on a signal line means "logic false" or the number "zero." A high voltage level on the same line means "logic true" or the number "one." Thus a signal line may assume one of two values, both of which are meaningful.

NULL convention has multiple implementations, all of which include a NULL state which has no meaning. In one implementation, two separate signal lines would be used to convey two meaningful values. For example, logic "false" would be conveyed by asserting a high voltage on the first line and a low voltage on the second line. Logic "true" would be conveyed by asserting a low voltage on the first line and a high voltage on the second line. NULL would be conveyed by low voltage levels on both lines. (Simultaneous high voltage levels on both lines is an unused combination.) In this example, meaning is expressed according to the signal line asserted, not by the choice of voltage level. A high voltage level "asserts" the meaning of the line. A low voltage level is meaningless.

In another implementation, multiple voltages can be used on a single line to convey multiple meanings and NULL. For example, each signal line may be allowed to assume three voltage levels. A positive voltage level asserts the meaning "true", a negative voltage level asserts the meaning "false", and the zero voltage level is NULL (meaningless). In other implementations, parameters other than voltage may be used, such as current levels, as long as the requisite number of states can be differentiated.

Descriptions here will assume an implementation in which each signal line may assume one of two voltage levels, with a high level asserting meaning (DATA) and the ground voltage level being NULL. This provides voltage levels as concrete examples to aid in explanation, but the invention is not limited to these voltage-level examples.

Figure 1:
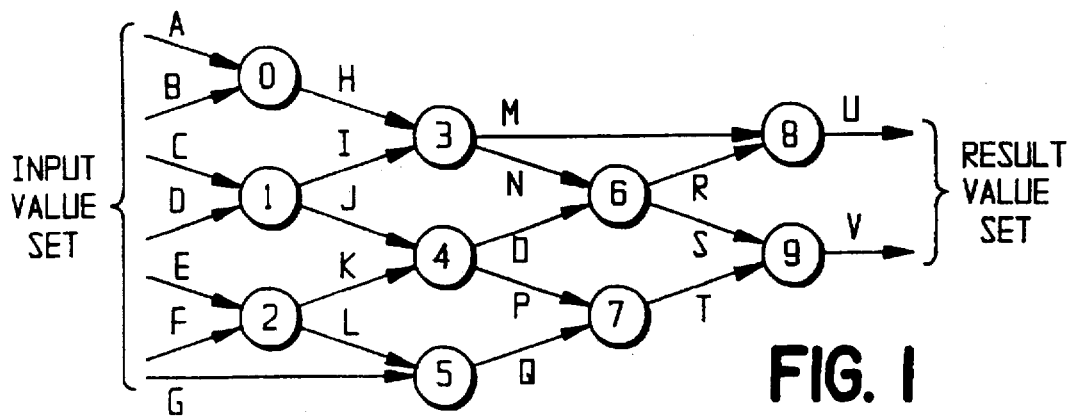
FIG. 1 illustrates a NULL convention combinational circuit.

Another important aspect of NULL convention circuits is the way that meaningful and NULL signals propagate through a combinational circuit. All inputs to a NULL convention logic element must be complete before the element asserts a meaningful output. FIG. 1 illustrates a NULL convention combinational circuit. In FIG. 1, logic gates are shown as circles and labeled with numerals 0–9. Input lines are labeled with letters A–G, output lines are labeled with letters U, V, and internal connection lines are labeled with letters H–T. Signal lines are schematic, and may be individual conductors, multiple conductors, or another NULL convention configuration.

In a NULL convention circuit, a logic gate transitions from a NULL to a meaningful output value after all, or a predetermined set of inputs have assumed meaningful values. For example, as illustrated in FIG. 1, assume that input lines A and B initially have NULL values, and logic gate zero (0) initially has a NULL output. In the case that only input line A transitions to a meaningful value (while input line B remains at NULL), logic gate zero will maintain a NULL output value. In the case that only input line B transitions to a meaningful value (while input line A remains at NULL), logic gate zero still will maintain a NULL output. When both input lines A and B transition to meaningful values (either simultaneously or sequentially), then logic gate zero (0) will change its output to a meaningful value.

The characteristic described above applies to all logic gates in the combinational circuit. Logic gates zero through two, which are directly connected to input lines, will provide meaningful values to the next level of gates (three through five) only when the respective inputs have completely assumed meaningful values. This produces a general result that can be visualized as a wavefront of meaningful values propagating through the network. At the network output, logic gates eight and nine will change their individual outputs from NULL to meaningful values only when all upstream gates have propagated meaningful values.

Two important characteristics should now be apparent. First, the network outputs transition from NULL to meaningful values cleanly. That is, the outputs do not switch back and forth while partial results have propagated through the intermediate gates. Second, the very presence of a meaningful value at the network output is sufficient to indicate that the network has conclusively resolved all intermediate logic operations. The very presence of a meaningful value is sufficient to indicate that the value is steady, complete, and may be used by downstream circuitry. Thus, no external clock is required to indicate that the network has completed its operations.

The NULL convention logic gates discussed here also exhibit a second characteristic; their outputs transition from a meaningful value to NULL only when all inputs have switched to NULL. In this way, NULL values also propagate through the network cleanly, and the transition to NULL values at the output is sufficient to indicate that all gates in the network have returned to NULL output states.

Figure 2A:
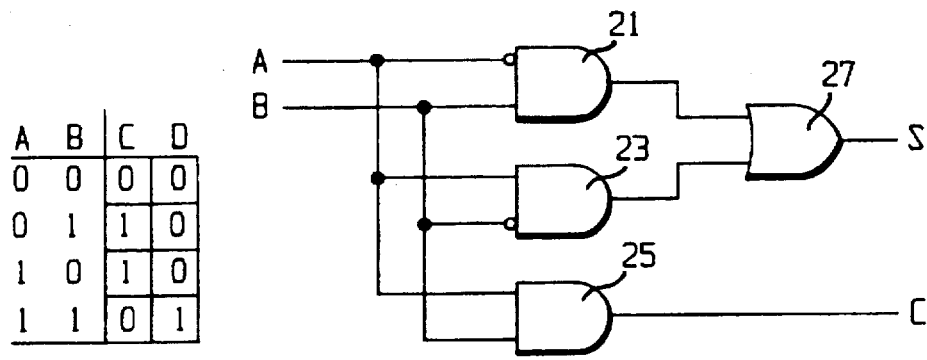
FIG. 2a illustrates a Boolean half-adder.

FIG. 2a illustrates a conventional Boolean half-adder constructed of three AND gates 21, 23, 25 and an OR gate 27. The half adder has two input signal lines A and B, and two output line S (sum) and C (carry). Each input line may assume one of two meaningful values: "zero" and "one." Each output line may assume one of two meaningful values: "zero" and "one." The half adder implements a transfer function such that:

i) when both inputs are zero, sum (S) and carry (C) outputs are "zero;"
ii) when a single input is "one" (and the other is "zero"), sum is "one" and carry is "zero;"
iii) when both inputs are "one," sum is "zero" and carry is "one."

Figure 2B:
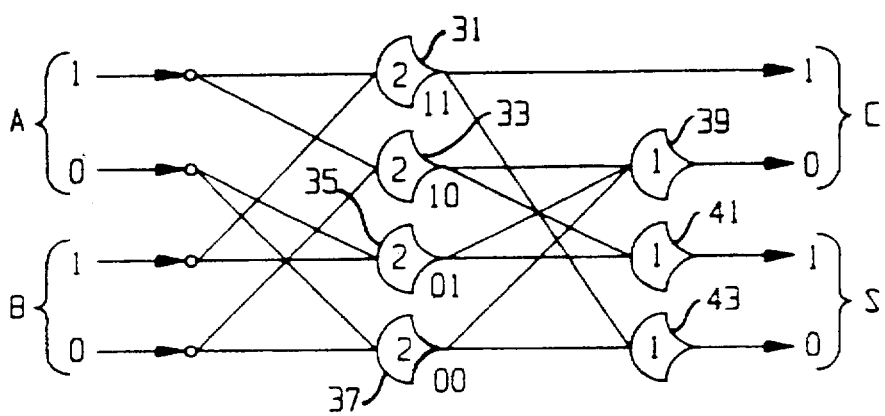
FIG. 2b illustrates a "two-wire" NULL convention half adder.

For comparison, FIG. 2b illustrates a "two-wire" NULL convention half adder. It is similar to the boolean half-adder of FIG. 2a in that there are two inputs A and B and two outputs S and C, and it implements the same transfer function. Unlike the Boolean circuit, the NULL convention half-adder has a separate signal line for each meaning. The carry output, for example, has two separate signal lines, each of which may assume one of two voltage levels. A first voltage level is meaningful and the other voltage level is NULL. In order to assert a meaning of "carry equals zero," the first signal line 32 (designated as having a meaning "zero" when asserted) is driven to its meaningful voltage level, while the second signal line is held at the NULL voltage level. In order to assert a value "carry equals one," the first signal line is held at the NULL voltage level, while the second signal line 34 (designated by design as having a meaning "one") is driven to the meaningful voltage level. The half-adder can also assert "carry has no meaning" by holding both carry signal lines at NULL. It is not permitted to have both carry lines at the meaningful voltage level. Similarly, the remaining inputs and outputs (A, B, S) each have a pair of signal lines. Each pair of lines is a "mutually exclusive assertion group," which means only one line of any group will be asserted at a time.

Hereafter, when a NULL convention circuit switches a signal line to a meaningful value, it will be said that the circuit "asserts DATA" the line, or that the line is "asserted." When a NULL convention circuit switches a signal line to a NULL value, the line will be said to be NULL or to assert NULL.

The two carry lines form a group in which at most one line may be asserted (i.e., assume a meaningful value). Such a group is referred to has a "mutually exclusive assertion group." In other design situations, mutually exclusive assertion groups may have more than two lines. A single line, by itself, can be considered a mutually exclusive assertion group.

Internally, the NULL convention half adder is made of six threshold gates 31, 33, 35, 37, 39, 41, 43. Each threshold gate has a single signal line output which may be asserted (assume a meaningful voltage level) or NULL (assume a NULL voltage level). The signal line may fan out to several destinations. Four of the gates 31, 33, 35, 37 have two input signal lines and a threshold of two ("threshold-two gate"). The output of a threshold-two gate is asserted when two (both) of the input lines are asserted. One of the gates 39 has three input signal lines and threshold of one ("threshold-one gate"). The output of the threshold-one gate is asserted when any one of the three inputs is asserted. Two of the gates 41, 43 have two inputs and a threshold of one. As a drawing convention, a numeral inside a threshold gate symbol indicates the number of asserted input lines needed to cause the gate to assert its output.

Each of the NULL convention gates of the half adder exhibits the characteristic that it switches to a meaningful value only when the requisite number of inputs becomes meaningful, and each threshold gate holds a meaningful output value until all of the inputs become NULL. Thus, threshold gates exhibit a hysteresis: as the number of inputs drops below the threshold, the output remains meaningful. For example, the threshold-two gates 31, 33, 35, 37 will maintain meaningful output levels when the number of meaningful inputs drops from two to one. The threshold-two gates will switch to NULL when all inputs become NULL.

It should be appreciated that a threshold gate forms a central building block of NULL convention logic circuits. The NULL convention threshold gates may be characterized by the number of inputs and the threshold value. NULL convention threshold gates have the unique operational requirement that some or all inputs will form mutually exclusive assertion groups. They further ensure completeness of the input set, in that they switch to a NULL output only when all inputs are NULL.

Figure 3A:
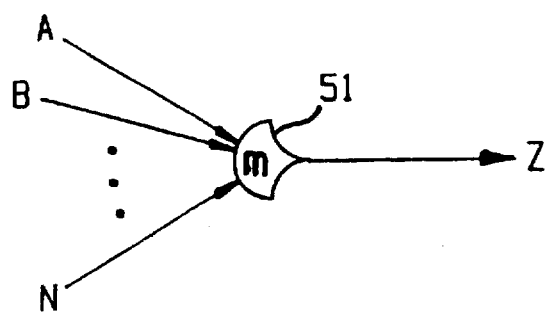
FIG. 3a illustrates a symbol for a NULL convention n-input threshold-m gate (m-of-n)

FIG. 3a illustrates a symbol 51 for an n-input threshold-m gate (m-of-n). The output Z becomes asserted when at least m of the n inputs is asserted. The output Z returns to NULL only when all of the inputs becomes NULL. This symbol will be used in many forms throughout this description, with the threshold value placed inside the symbol. The number of input signal lines will be apparent from context.

Figure 3B:
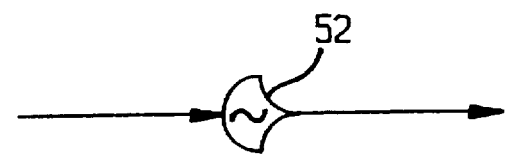
FIG. 3b illustrates a symbol for a NULL convention inverting gate.

FIG. 3b illustrates a symbol 52 for an inverting gate. An inverting gate generates a NULL signal in response to an asserted signal, and asserts DATA signal in response to a NULL signal. When a NULL convention system is implemented as a two-voltage system, with one voltage signifying data and a ground voltage signifying NULL, a conventional boolean inverting gate can be used as a NULL convention inverting gate.

Null Convention Logic Bus

A bus is a system structure that connects other system structures together in a flexible way. The duty of a NULL convention logic bus is to pass a DATA and NULL wavefront pair from a selected transmission port on the bus to a selected receiver port on the bus.

Basic Combinational Bus

Figure 4:
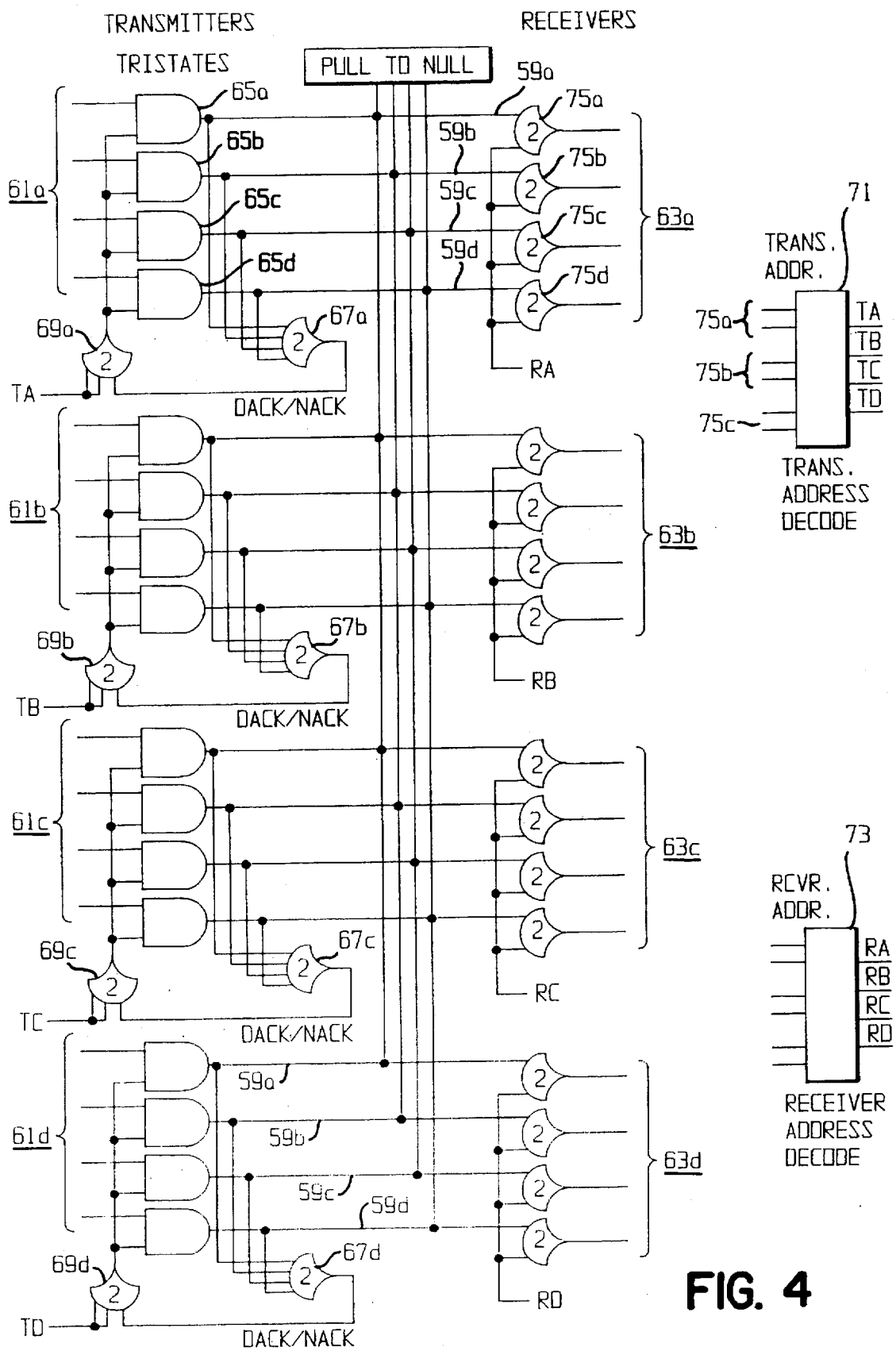
FIG. 4 illustrates an example of a combinational form of a NULL convention logic bus.

FIG. 4 shows an example of a combinational form of a NULL convention logic bus using tristate drivers to drive the bus. This particular example includes four conduction lines 59a, 59b, 59c, 59d pulled to the NULL logic level. It will be assumed that a first pair of transmission lines 59a, 59b form a first mutually exclusive assertion group such that at most one transmission line will be asserted at a time, and that a second pair of transmission lines 59c, 59d form a second mutually exclusive assertion group. The bus also includes: four transmitter ports 61a, 61b, 61c, 61d, and four receiver ports 63a, 63b, 63c, 63d; a transmit address decoder 71 and a receive address decoder 73.

Transmitter port 61a includes: four tristate drivers 65a, 65b, 65c, 65d, a first threshold-two NULL convention logic gate (referred to here as a "watcher") 67a; and a second threshold-two gate 69a (referred to here as a "transmit enable" gate). Each of the tristate drivers 65a, 65b, 65c, 65d operates as a traditional, boolean "AND" tristate driver and receives one input from the transmit enable gate 69a, and a second data input from upstream circuitry (not shown). Data to be transmitted on the bus is received from upstream circuitry (not shown) on the second data inputs. Each of the tristate drivers 65a, 65b, 65c, 65d has an output connected to one of the bus transmission lines 59a, 59b, 59c, 59d.

The watcher 67a is a two-of-four gate which receives four inputs, one from each of the bus transmission lines 59a, 59b, 59c, 59d. The watcher output is one input to the transmit enable gate 69a. The other two inputs to the transmit enable gate 69a are both connected to a single address line TA received from the transmitter address decoder 71. The other three transmission ports 61b, 61c and 61d have identical construction, except that each receives a distinct set of input data signals, and each receives a distinct address signal line TB, TC, TD from the transmit address decoder 71.

Receiver port 63a includes four NULL convention two-of-two gates 75a, 75b, 75c, 75d (referred to here as "receiver gates"), each receiving a first input from a distinct bus transmission line 59a, 59b, 59c, 59d, and each receiving a second input RA from the receive address decoder 73. The outputs from the receiver gates are the data to be delivered to a downstream receiving circuit (not shown).

Transmitter address decoder 71 is a NULL convention combinational circuit receiving at least two inputs 75a, 75b, each a mutually exclusive assertion group. The transmitter address decoder 71 also has four output signal lines TA, TB, TC, TD which collectively form a single mutually exclusive assertion group. The transmitter address decoder performs a two-to-four decode. Input lines 75a form a first bit of a binary number, while input lines 75b form a second bit of a binary number. The two-bit binary number has four possible pairs of values (0,0; 0,1; 1,0; 1,1). The transmitter address decoder asserts a single output line TA in response to the 0,0 input; asserts a single output line TB in response to the 0,1 input; etc. Receiver address decoder 73 is substantially the same as the transmission address decoder 71. Transmitter addresses and receiver addresses are received from a bus control circuit (not shown) which may be designed according to the specific requirements of an application.

Operation of the transmitter ports, the receiver ports, and the address decoders will be explained with reference to FIGS. 5a–5h, which illustrate the sequence of behavior of the elements of the combinational bus. Narrow lines indicate wires asserting NULL (0 volts). Wide (heavy) lines indicate wires asserting data (5 volts). Circuit elements that are identical to those illustrated in FIG. 4 will be given identical reference numerals.

Figure 5A:
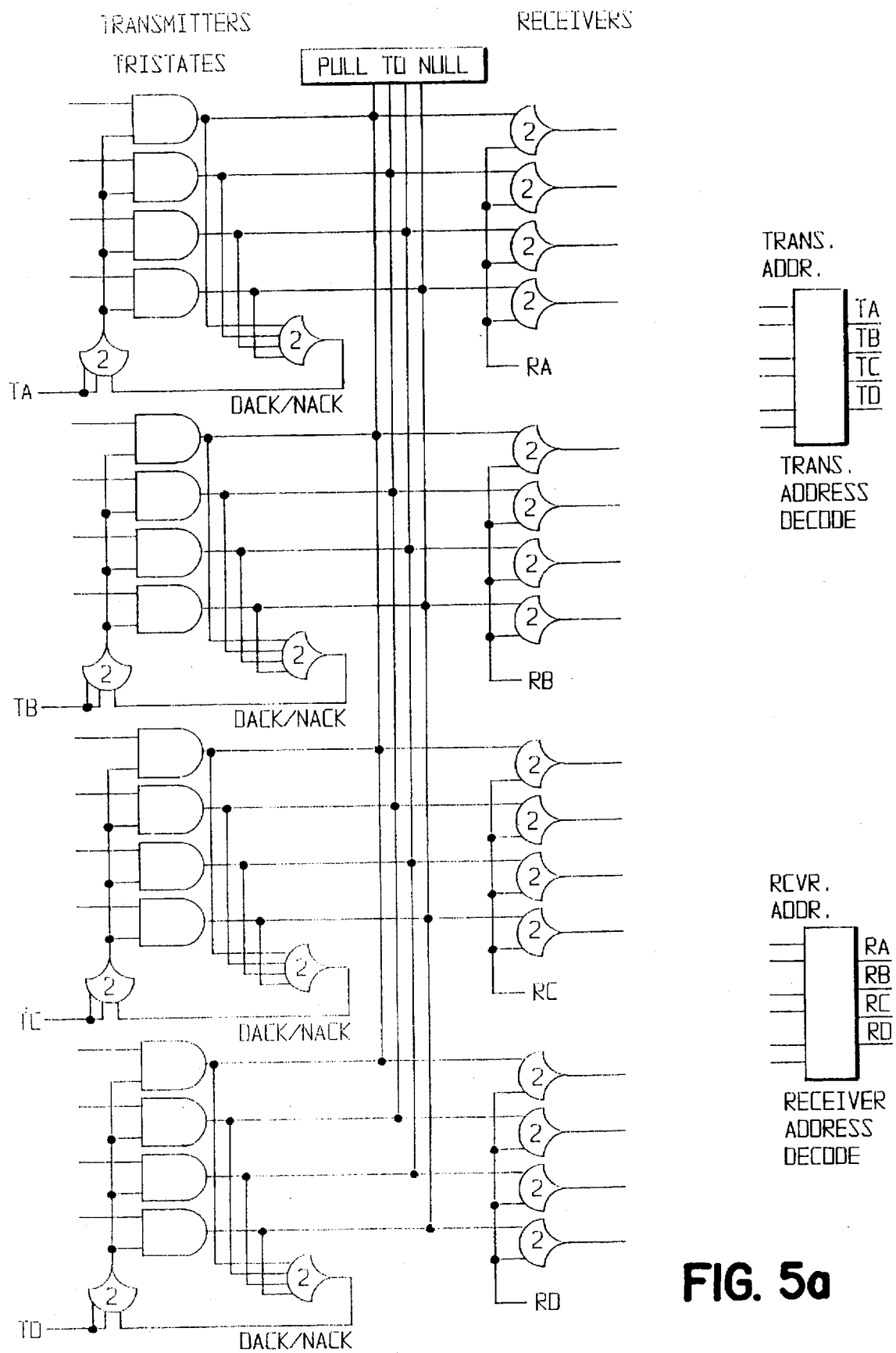
FIG. 5a–5h illustrate the sequence of the behavior of elements of the combinational bus of FIG. 4.

In Figure 5a, the bus is in a NULL state awaiting a DATA wavefront. All signal lines assert NULL.

Figure 5B:
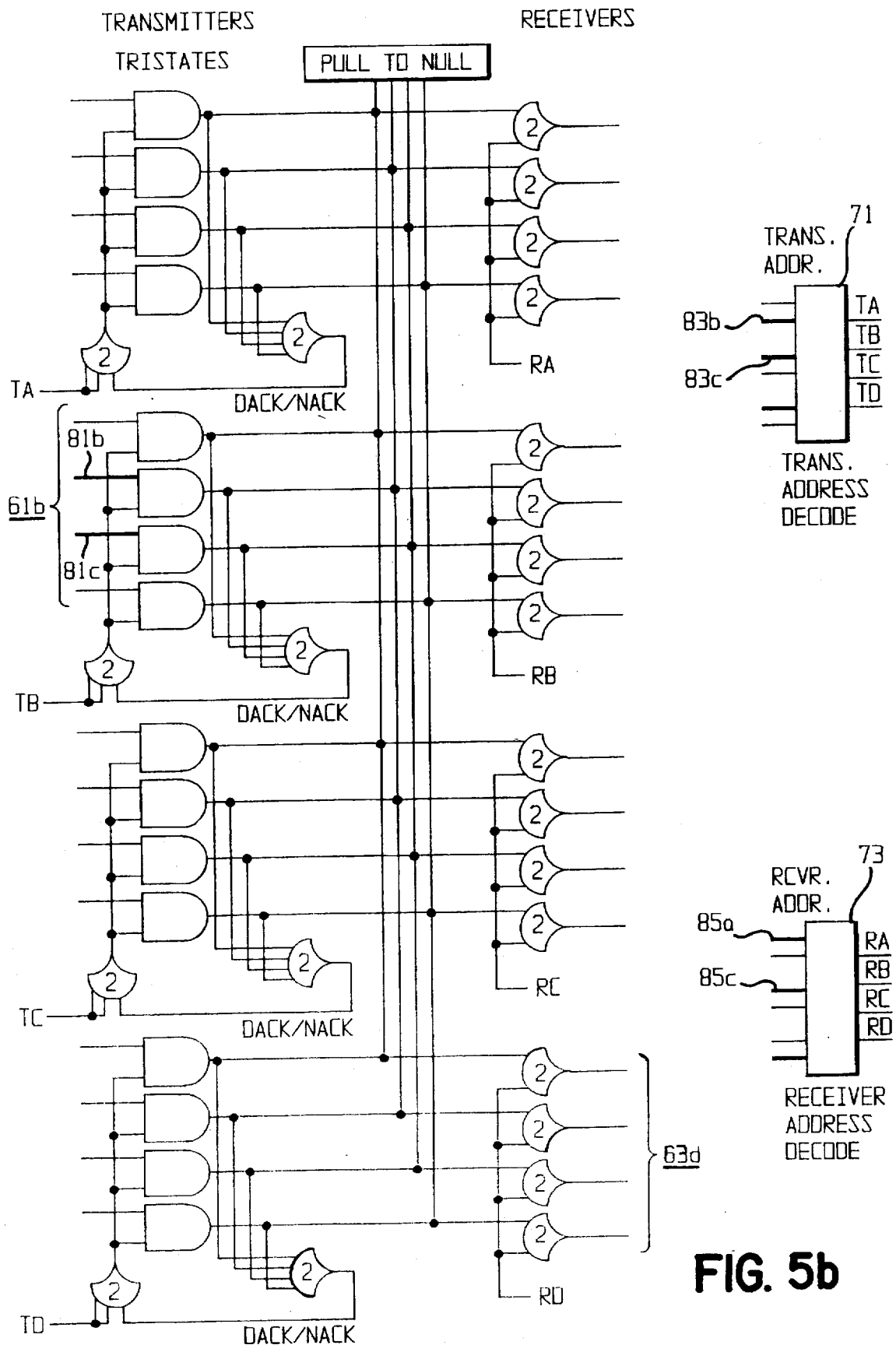

In FIG. 5b, the DATA wavefront arrives in three parts; 1) as a data set presented to transmitter port 61b, with asserted input signal lines 81b and 81c; 2) as a transmitter address presented to the transmitter address decoder with asserted input lines 83b and 83c; and 3) as a receiver address presented to the receiver address decoder with asserted input lines 85a and 85c. The data wavefront and the transmitter address will be synchronized into a single data wavefront over the bus by the transmitter port 61b. The bus data wavefront will be synchronized with the receiver address into a single data wavefront exiting the bus by the receiver port.

Figure 5C:
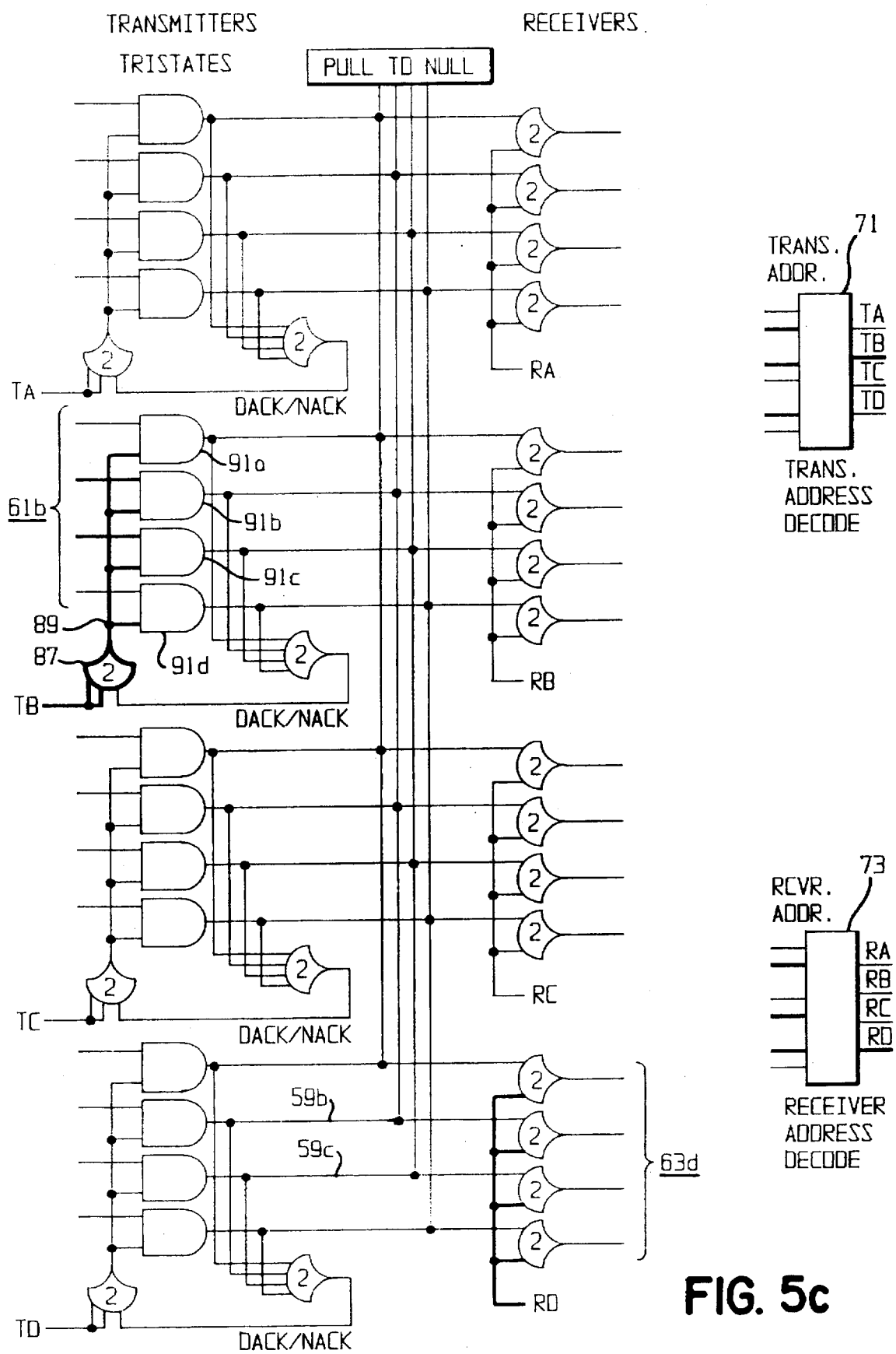

In FIG. 5c, the transmitter address decoder 71 and the receiver address decoder 73 each decode their respective inputs into address strobes TB and RD, and the decoders 71, 73 present the strobes to the transmitter port 61b and the receiver port 63d. The transmit enable gate 87 of transmitter port 61b receives the address strobe TB. Because the address strobe provides two inputs, and because the transmit enable gate 87 has a threshold of two, transmit enable gate 87 asserts its output 89. The asserted output 89 provides one asserted input to all four tristate drivers 91a, 91b, 91c, 91d.

The data wavefront will pass through the transmitter port 61b onto the bus transmission line 59a, 59b, 59c, 59d (as discussed below), but not until the data wavefront and the address strobe are both present. If the address strobe arrives at a transmitter port early, it will not create an erroneous data wavefront on the bus transmission lines. If the data arrives at the transmitter port early, it will not pass until the address strobe arrives. The two wavefronts are synchronized into a single data wavefront by the transmitter port. The transmitter port thus enforces the completeness of input criteria for data.

Figure 5D:
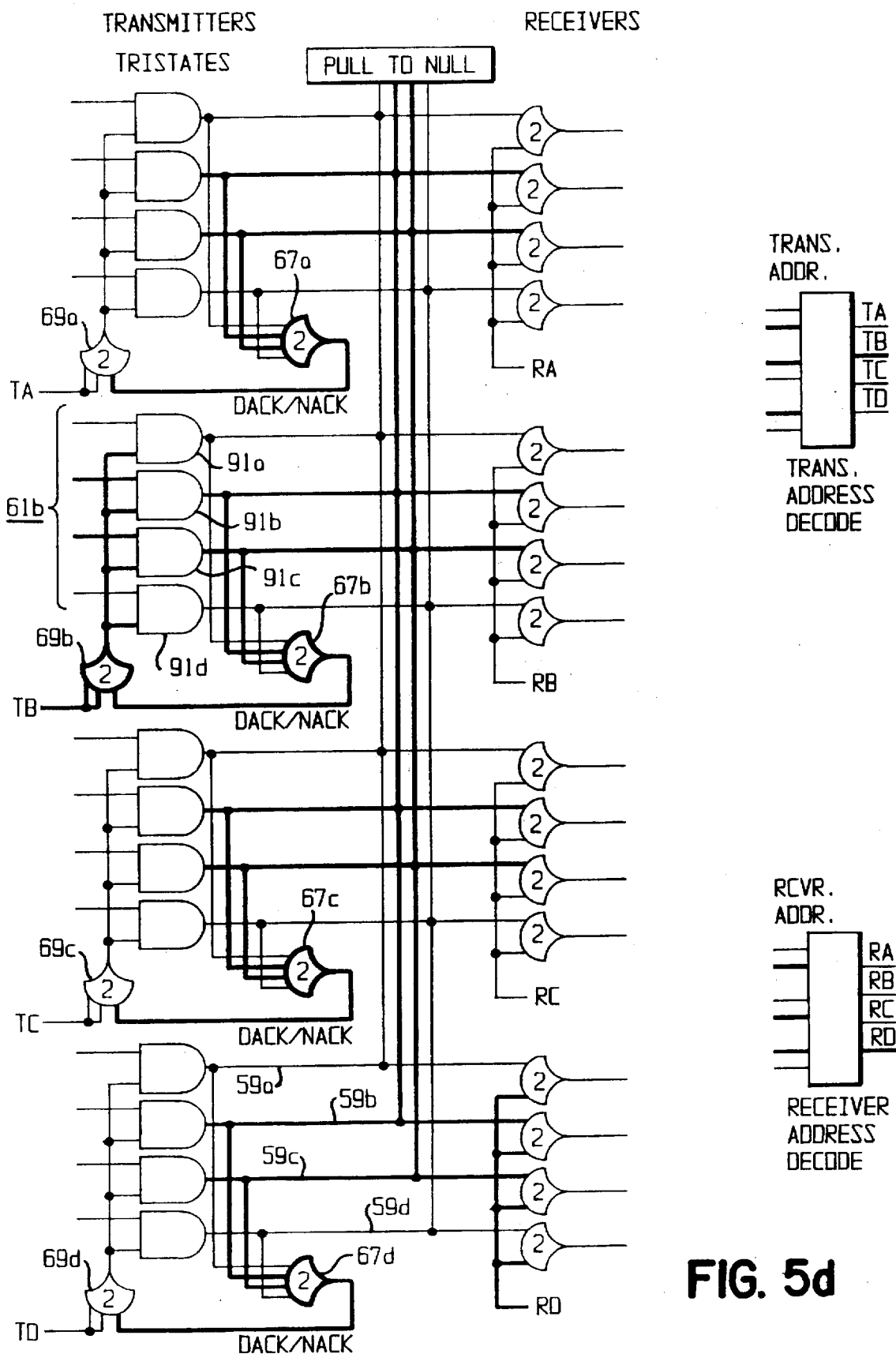

In FIG. 5d, the data wavefront passes through transmitter port 61b via the enabled tristate driver 91a, 91b, 91c, 91d and is presented on the bus transmission lines 59a, 59b, 59c, 59d. The watchers 67a, 67b, 67c, 67d of all transmission ports detect the data wavefront and assert DATA values to their respective transmit enable gates 69a, 69b, 69c, 69d. For all of the transmitter ports that are not addresses, this has no effect because the single asserted input does not rise above the threshold two level, and does not cause the non-selected transmit enable gate to become asserted. For those non-selected ports, any data that might be presented remains blocked.

As discussed more below, for the one addressed transmitter port 61b, the asserted signal from the watcher 67b will maintain the enable gate 69b and the tristate drivers 91a, 91b, 91c, 91d enabled until after the address strobe TB becomes NULL, and until after the actual NULL wavefront passes through the tristate drivers 91a, 91b, 91c, 91d.

Figure 5E:
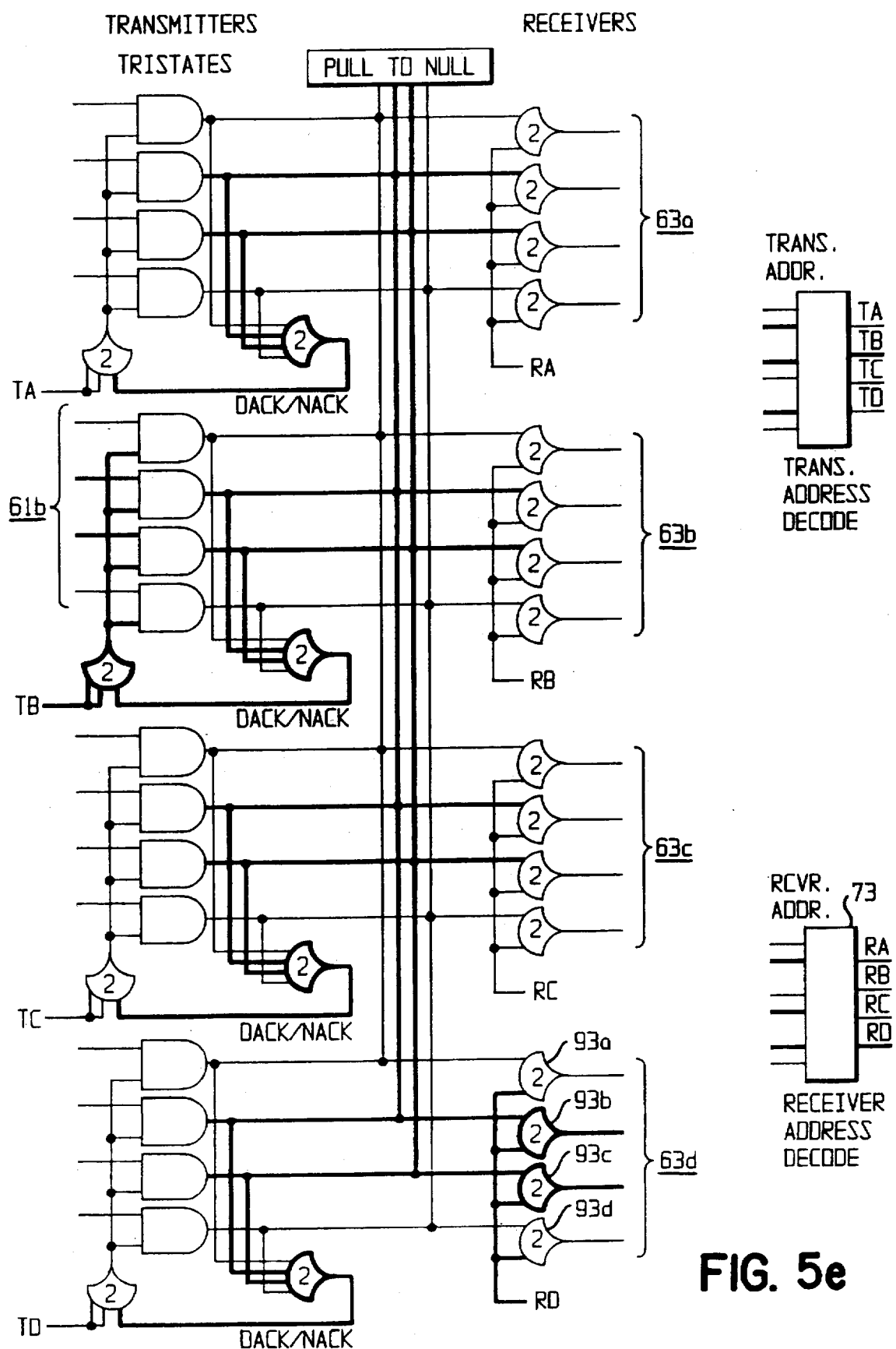

In FIG. 5e, the data wavefront passes through the selected receiver port 61b, and arrives at all receiver ports 63a, 63b, 63c, 63d. If the data wavefront arrives at the receiver gates 93a, 93b, 93c, 93d before the address strobe RD from the receiver address decoder 73, then the receiver gates 93a, 93b, 93c, 93d block the data (i.e., prevent it from passing downstream. If the address strobe RD arrives at the receiver port 63d before the data wavefront, then the bus is in a NULL state and a false data wavefront will not be generated. The bus data wavefront and the receiver address wavefront are synchronized into a single data wavefront exiting-the bus through the receiver port 63d. The receiver port enforces the completeness of input criteria for data.

The data wavefront now has played through the bus with full delay insensitivity, and the bus is in a stable state awaiting the NULL wavefront. At the non-selected receiver ports, the receiver gates block the data from passing from the bus to unintended circuits.

Figure 5F:
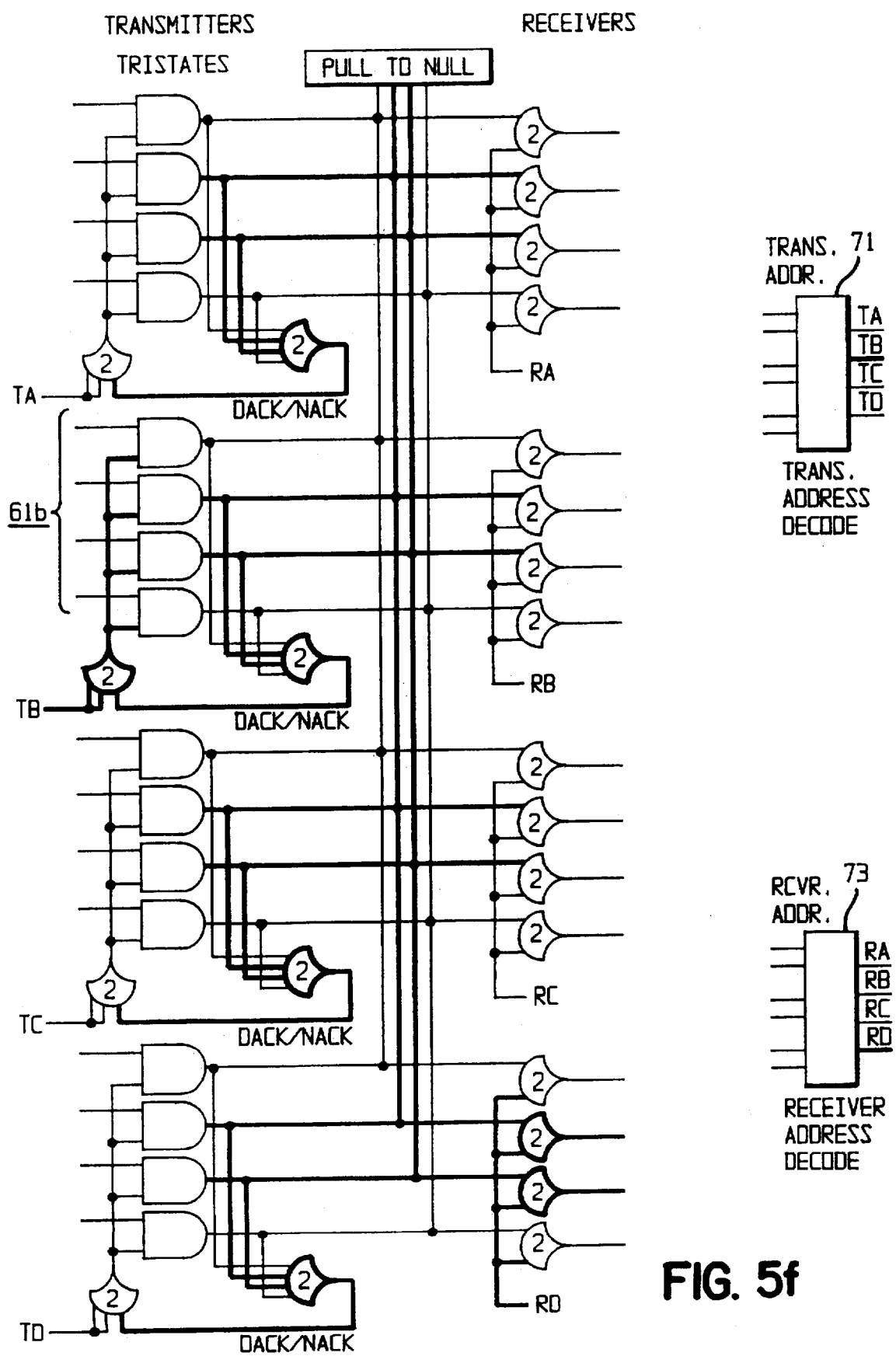

In FIG. 5f, a NULL wavefront arrives at the transmitter port 61b and at the inputs of the address decoders 71, 73. All other previously asserted gates and drivers remain asserted.

Figure 5G:
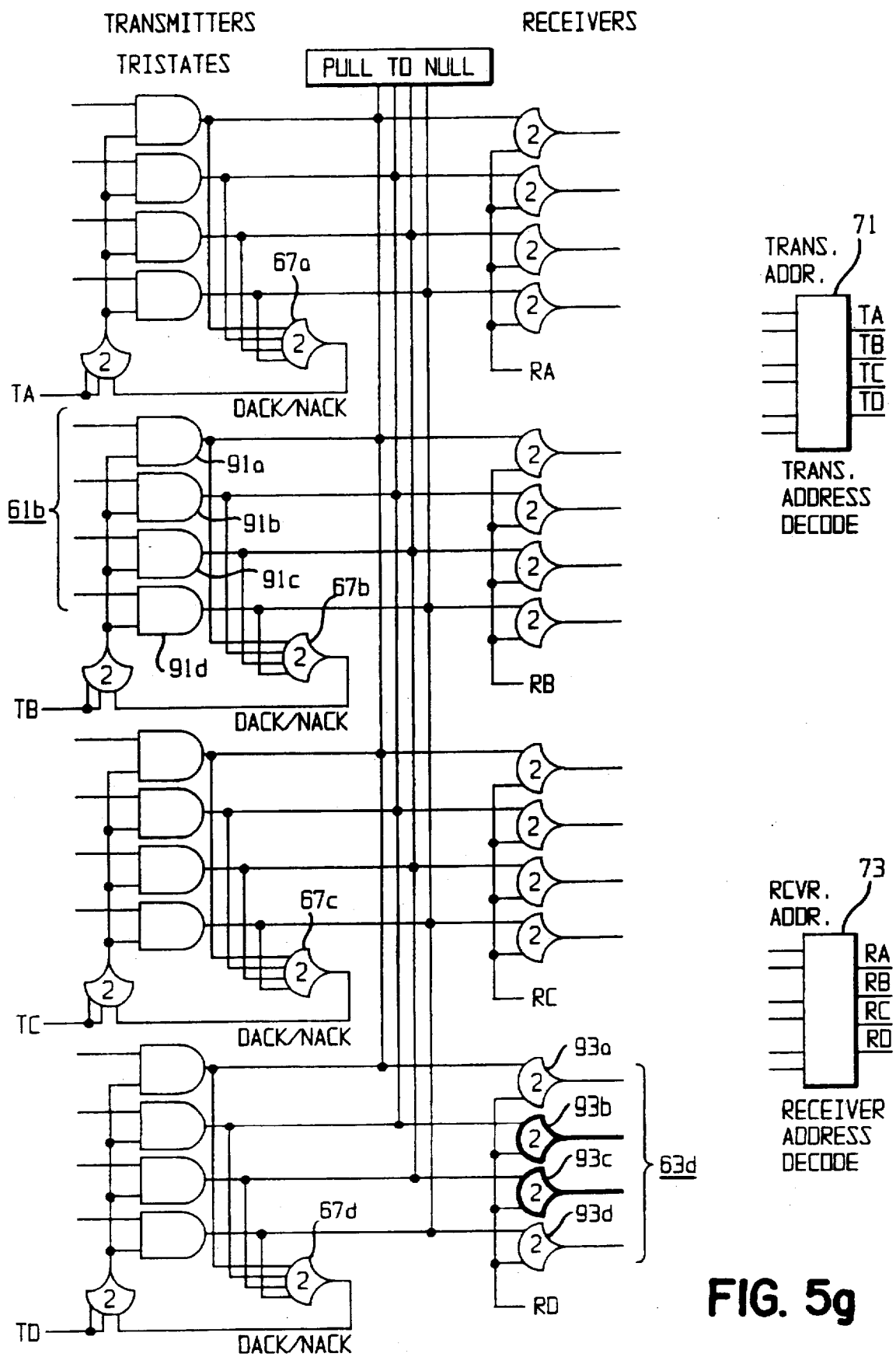

In FIG. 5g, the NULL wavefront immediately passes through the tristate drivers 91a, 91b, 91c, 91d of the selected transmit port 61b to the bus. The transmitter decoder 71 and receiver address decoder 73 return the respective address lines TB, RD to NULL.

If the NULL wavefront arrives from the bus at the receiver port 63d before the address strobe RD returns to NULL (i.e., while still asserted), the receiver gates 93a, 93b, 93c, 93d maintain their outputs (asserted or not according to the data), because the threshold-two receiver gates 93a, 93b, 93c, 93d do not return to NULL until all inputs return to NULL. The NULL wavefront is blocked. If the address strobe RD returns to NULL before the NULL wavefront (i.e., while the bus is in a DATA state), the receiver gates 93a, 93b, 93c, 93d maintain their outputs, and a false NULL wavefront will not be generated. The bus NULL wavefront and the receiver address strobe NULL wavefront are synchronized into a single NULL wavefront exiting the bus through the receiver. The receiver enforces the completeness of input criteria for NULL.

The NULL wavefront on the bus is detected by all the watchers 67a, 67b, 67c, 67d, which return their outputs to NULL. The tristate drivers 91a, 91b, 91c, 91d of the selected transmitter port 61b are turned off, but only after the transmit address strobe TB has become NULL and the NULL wavefront has been detected on the bus. Detecting the NULL wavefront on the bus ensures that the bus has actually been driven to NULL (ground) before turning off the tristate drivers 91a, 91b, 91c, 91d. Detecting the NULL wavefront on the bus itself allows the tristate drivers to drive the bus to NULL quickly, after which weak pull down devices can maintain the bus at NULL when the tristates are turned off and the bus is isolated.

The propagation of NULL through a transmitter port is not fully delay insensitive. If a watcher and its feedback path are very slow, the next data wavefront might arrive before the tristate drivers are turned off. It is only necessary to ensure that this feedback path resolves before the next data wavefront arrives. This is the same requirement that a feedback path around each gate must fulfill. (Use of feedback around gates is described in co-pending U.S. patent application Ser. No. 08/368,811 and is incorporated here by reference). The watcher and its feedback path can be placed as locally as desired to the tristate drivers to fulfill this requirement, and this embodiment contemplates a watcher for each port positioned in proximity to the associated tristate drivers.

Figure 5H:
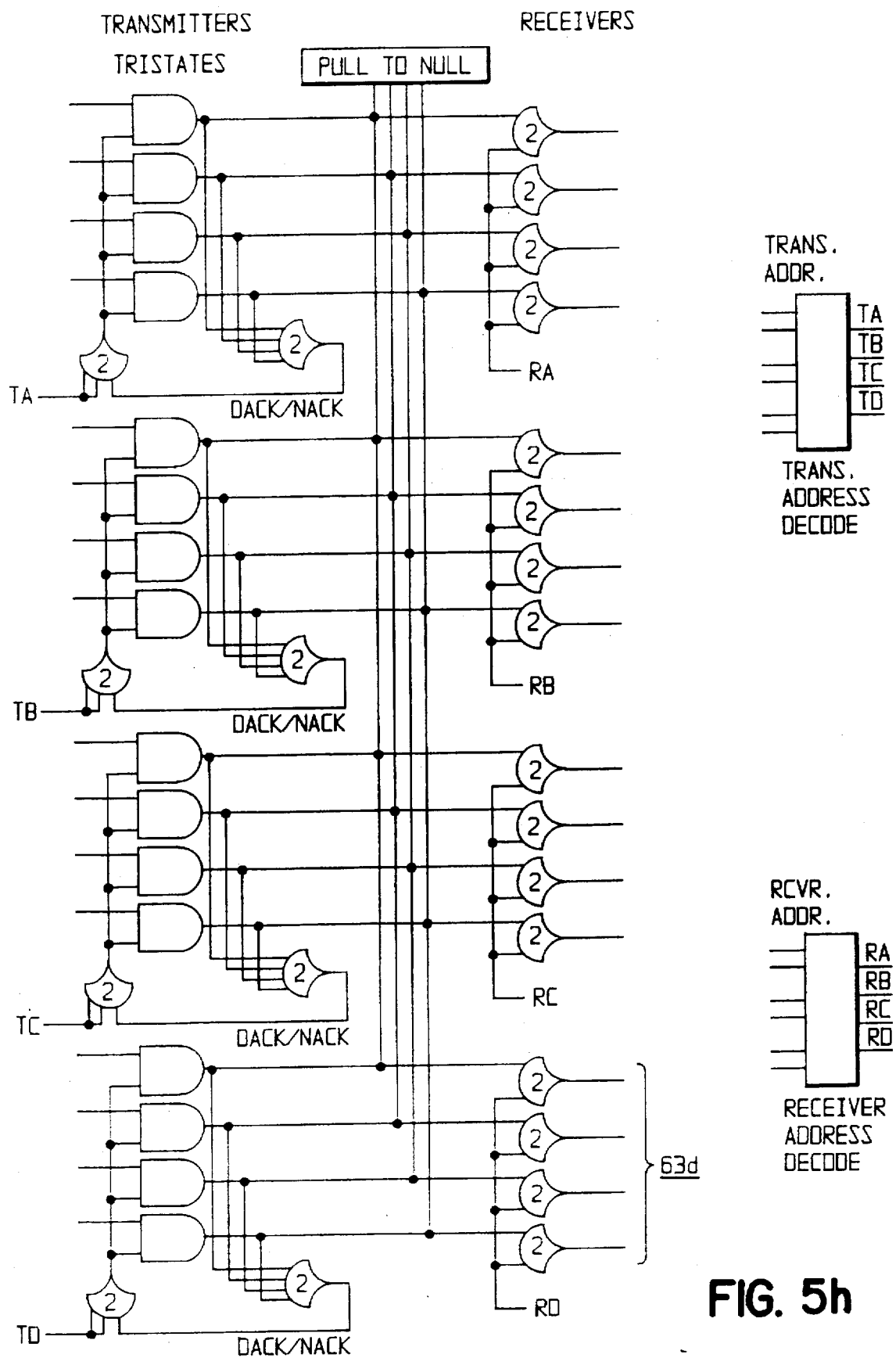

In FIG. 5h, the NULL wavefront has passed through the selected receiver port 63d, and the bus has returned to its initial all-NULL state awaiting another data wavefront as in FIG. 5a.

Figure 6:
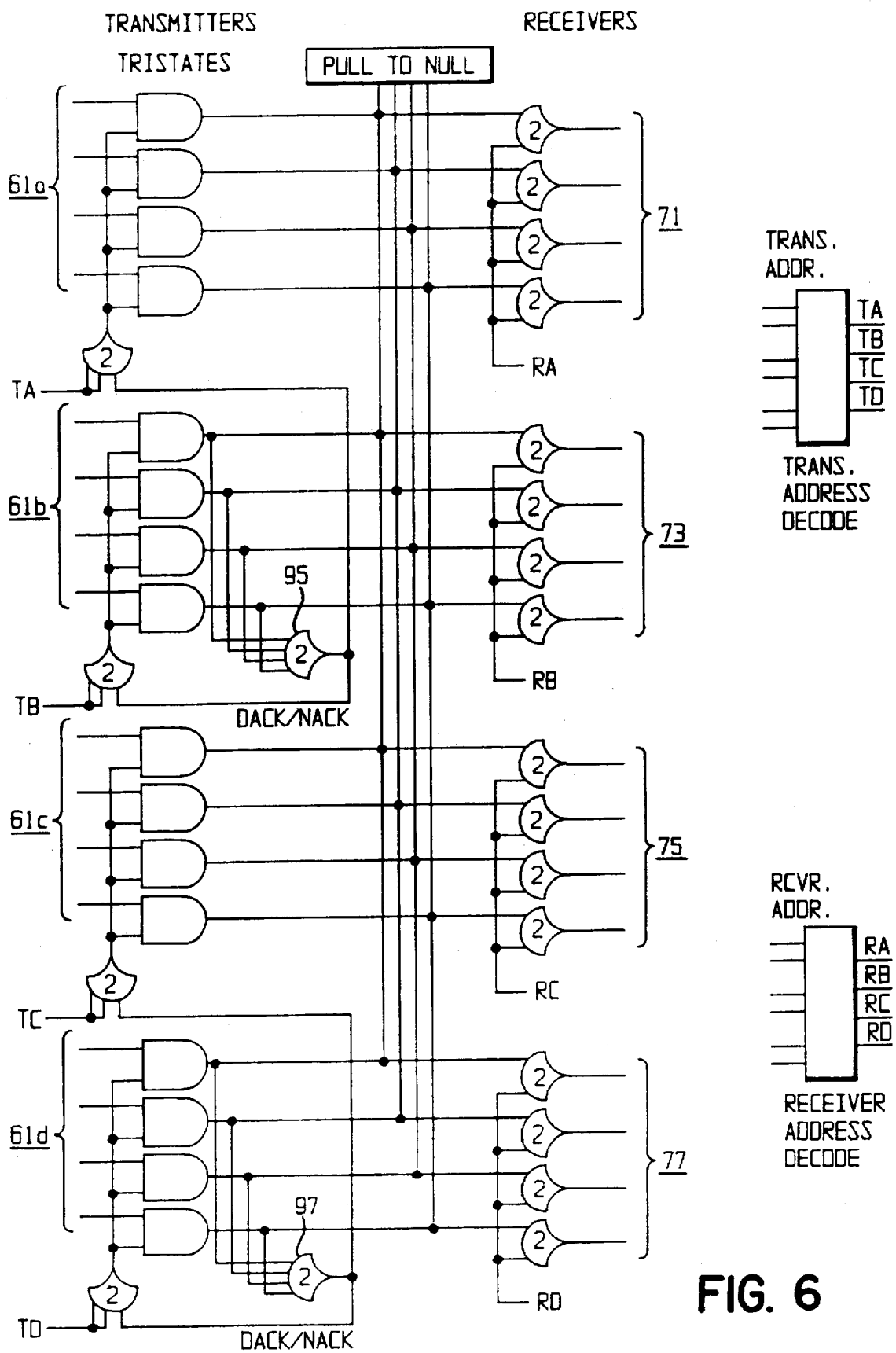
FIG. 6 illustrates a NULL convention bus with locally-positioned watchers.

In the previous example, each transmitter port had a separate watcher 67a, 67b, 67c, 67d watching the same set of wires on the bus. These four watchers can be reduced to a single watcher that fans out its acknowledge to all the transmitter ports. If the bus is sprawling, there can be a watcher for each locality of transmitters as shown in FIG. 6. Here, it is assume that transmitter ports 61a and 61b are local to each other, that transmitter ports 61c and 61d are local to each other, but that ports 61a and 61b are remote from 61c and 61d. In this variation, ports 61a and 61b share a single watcher 95, while ports 61c and 61d share another watcher 97.

A pipeline stage NULL Convention logic bus

A pipeline stage bus can be achieved by surrounding the combinational bus described above with synchronous registers as shown in FIG. 7. The pipeline bus of FIG. 7, like the combinational bus of FIG. 4, includes four conduction lines 59a, 59b, 59c, 59d pulled to the NULL logic level. A first pair of transmission lines 59a, 59b form a first mutually exclusive assertion group such that at most one transmission line will be asserted at a time, and a second pair of transmission lines 59c, 59d form a second mutually exclusive assertion group. The bus also includes: four pipeline transmitter ports 101a, 101b, 101c, 101d; four pipeline receiver ports 103a, 103b, 103c, 103d; a transmit address decoder 71; and a receive address decoder 73.

Figure 7:
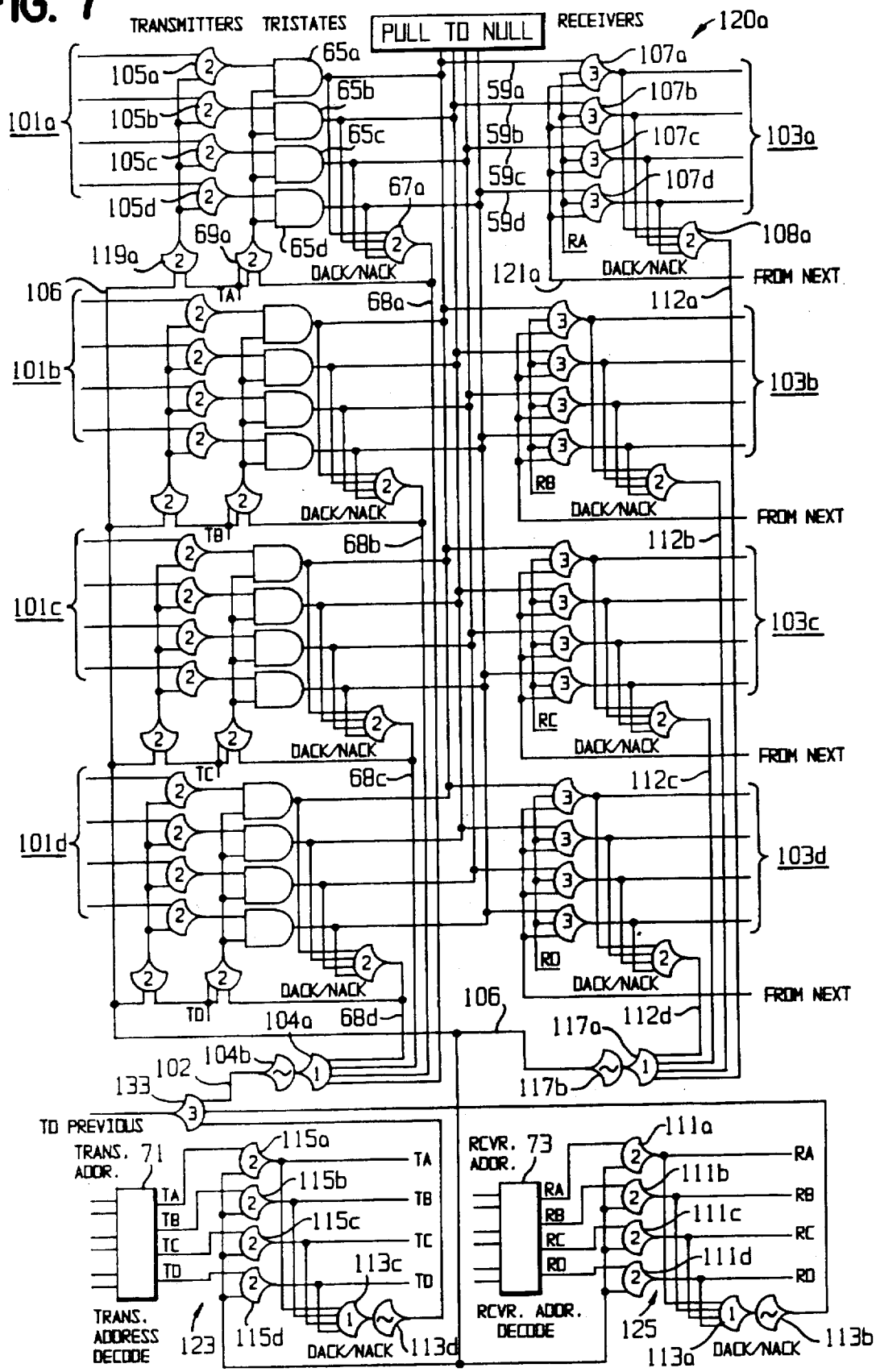
FIG. 7 illustrates a pipeline stage NULL convention logic bus.

Pipeline transmitter port 101a of the pipeline register bus of FIG. 7, like the transmitter port 61a of FIG. 4, includes: four tristate drivers 65a, 65b, 65c, 65d, a first threshold-two NULL convention logic gate (referred to here as a "watcher") 67a; and a second threshold two gate 69a (referred to here as a transmit "enable" gate). Pipeline transmitter port 101a of the pipeline register bus further includes four threshold-two gates 105a, 105b, 105c, 105d, referred to here as input "register gates," and a fifth threshold two-gate 119a. Each input register gate receives one data input from a circuit providing data for transmission over the bus (not shown). The outputs of the input register gates 105a, 105b, 105c, 105d become data inputs to respective tristate drivers 65a, 65b, 65c, 65d. The fifth threshold-two gate 119a receives a feedback signal 106 from receiver ports as well as an address signal TA, and generates an enable signal to the four input register gates.

The other three pipeline transmitter ports 101b, 101c and 101d have substantially the same construction as pipeline transmission port 101a. A DACK/NACK watcher gate 104a and an associated inverter gate 104b monitor the four DACK/NACK signals 68a, 68b, 68c, 68d from the pipeline transmitter ports 101a, 101b, 101c, 101d and provide a composite feedback signal 102.

Pipeline receiver port 103a, like receiver port 63a of FIG. 4, includes four NULL convention gates 107a, 107b, 107c, 107d (referred to here as "pipeline receiver gates"), each receiving a first input from a distinct bus transmission line 59a, 59b, 59c, 59d, and each receiving a second input RA from the receive address decoder 73.

The pipeline receiver port of FIG. 7 differs from the receiver port of FIG. 4 in that the port of FIG. 7 further includes a watcher gate 108a. The watcher gate 108a is a two-of-four gate which monitors the four outputs from the pipeline receiver gates and, when two are asserted, provides a DACK/NACK feedback signal 112a. A one-of-four gate 117a and an associated inverter gate 117b monitor DACK/NACK signals 112a, 112b, 112c, 112d from all receiver ports and, when any one is asserted, generates a composite feedback signal 106 for use by transmitter ports.

The pipeline receiver port of FIG. 7 also differs from the receiver port of FIG. 4 in that the pipeline receiver gates 107a, 107b, 107c, 107d are three-of-three gates which receive a feedback signal 121a from downstream circuitry (not shown). The addition of the watcher 108a and addition of the feedback signal 121a converts the pipeline register gates into an asynchronous storage register, which will be referred to here as a "receiver register" 120a. The operation of asynchronous registers is described in co-pending U.S. patent application Ser. No. 08/318,508, incorporated here by reference. The other three pipeline receiver ports 103b, 103c and 103d have substantially the same construction as pipeline receiver port 103a.

The transmitter address decoder 71 of the pipeline bus of FIG. 7 is identical to the transmitter address decoder 71 of the combinational bus of FIG. 4. The pipeline bus additionally includes four NULL convention gates 115a, 115b, 115c, 115d, referred to here as transmit address register gates, and a DACK/NACK monitor 117a. The DACK/NACK monitor 117a is a one-of-four gate which monitors the outputs of the four transmitter register gates 115a, 115b, 115c, 115d and provides a feedback signal through gate 133 to upstream circuitry generating the data transmitted on the bus (not shown). The transmit register gates 115a, 115b, 115c, 115d and the DACK/NACK monitor 117a form an synchronous storage register which is referred to here as the transmit address register 123.

The receiver address decoder 73 of the pipeline bus of FIG. 7 is identical to the address decoder 73 of the combinational bus of FIG. 4. The pipeline bus additionally includes four NULL convention gates 111a, 111b, 111c, 111d, referred to here as receive address register gates, and a DACK/NACK monitor 113a. The DACK/NACK monitor 113a is a one-of-four gate which monitors the outputs of the four receive address register gates 111a, 111b, 111c, 111d and provides a feedback signal through gate 133 to upstream circuitry generating the data transmitted on the bus (not shown). The receive address register gates 111a, 111b, 111c, 111d and the DACK/NACK monitor 113a form an asynchronous storage register which is referred to here as the receiver address register 125. The pipeline register bus further includes a number of additional NULL convention gates which will be described below while describing operation of the bus.

Operation of the transmitter ports 101a–101d, the receiver ports 103a–103d, the address decoders 71, 73, address registers 123, 125 and other gates will be explained with reference to FIGS. 8a–8h, which illustrate the sequence of the behavior of the elements of the pipeline bus. Narrow lines indicate wires asserting NULL (0V). Wide (heavy) lines indicate wires asserting data (5V). Circuit elements that are identical to those illustrated in FIG. 7 will be given identical reference numerals.

Figure 8A:
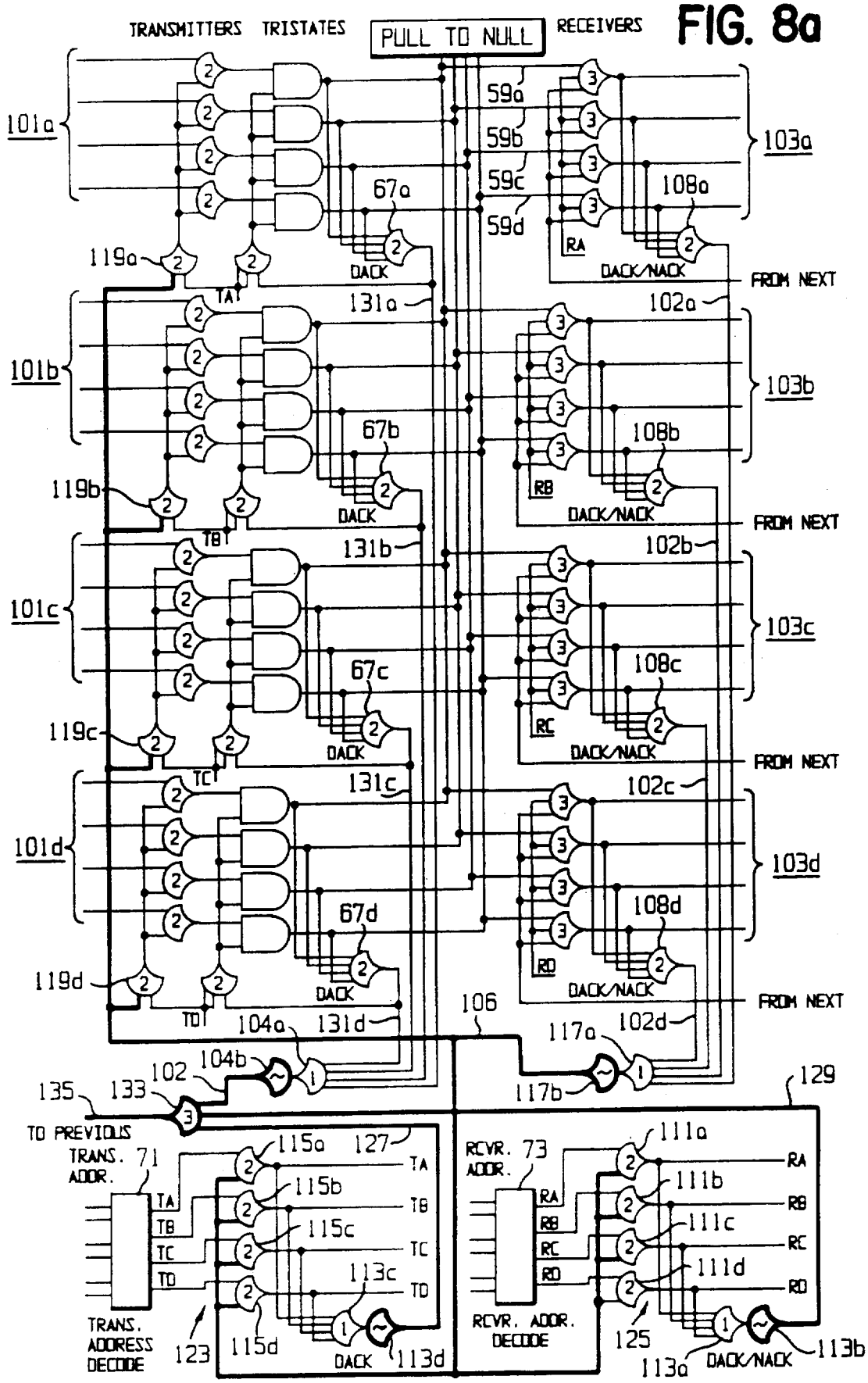
FIGS. 8a–8h illustrate the sequence of behavior of elements of the pipeline bus of FIG. 7.

In FIG. 8a, the bus circuit begins in an all NULL state. Address inputs to the transmitter address decoder 71 and receiver address decoder 73 are NULL, and address outputs TA, TB, TC, TD, RA, RB, RC, RD from the transmit address register 123 and receive address register 125 are NULL. Input data lines to the pipeline transmitter ports 101a, 101b, 101c, 101d are NULL, bus transmission lines 59a, 59b, 59c, 59d are NULL, and output data lines from the pipeline receiver ports 103a, 103b, 103c, 103d are NULL.

Each register stage requests data from the previous stage. Watcher gates 108a, 108b, 108c, 108d of receiver ports 103a, 103b, 103c, 103d sense no asserted data, and they assert NULL on DACK/NACK signal lines 102a, 102b, 102c, 102d. Gates 117a, 117b sense no asserted DACK/NACK signals and (by operation of inverting gate 117b), assert DATA on signal line 106. The asserted signal line 106 has no effect on input register gates 119a, 119b, 119c, 119d, because the input register gates are threshold-two gates and now receive only one asserted data input. The asserted signal line 106 also has no effect on transmitter address register gates 115a, 115b, 115c, 115d or on receiver address register gates 111a, 111b, 111c, 111d because those are threshold-two gates and receive only one asserted data input.

Watcher gates 117a, 117b of the transmitter address register 123 sense no asserted DATA address lines, and (by operation of the inverting gate 117b) assert DATA on output signal line 127. Watcher gates 113a and 113b of the receiver address register 125 sense no asserted address lines, and (by operation of inverting gate 113b) assert DATA on an output signal line 129. The four watcher gates 67a, 67b, 67c, 67d of the transmitter ports 101a, 101b, 101c, 101d sense no asserted data lines and assert NULL on DACK/NACK signal lines 131a, 131b, 131c, 131d. Watcher gates 104a, 104b sense no asserted DACK/NACK signal lines 131a, 131b, 131c, 131d and (by operation of inverting gate 104b) asserts DATA on signal line 102. Three-of-three gate 133 sense three asserted inputs (signal lines 102, 129 and 127), and asserts DATA on signal line 135, which is a request to upstream circuitry (not shown) that the bus is ready to accept data.

Figure 8B:
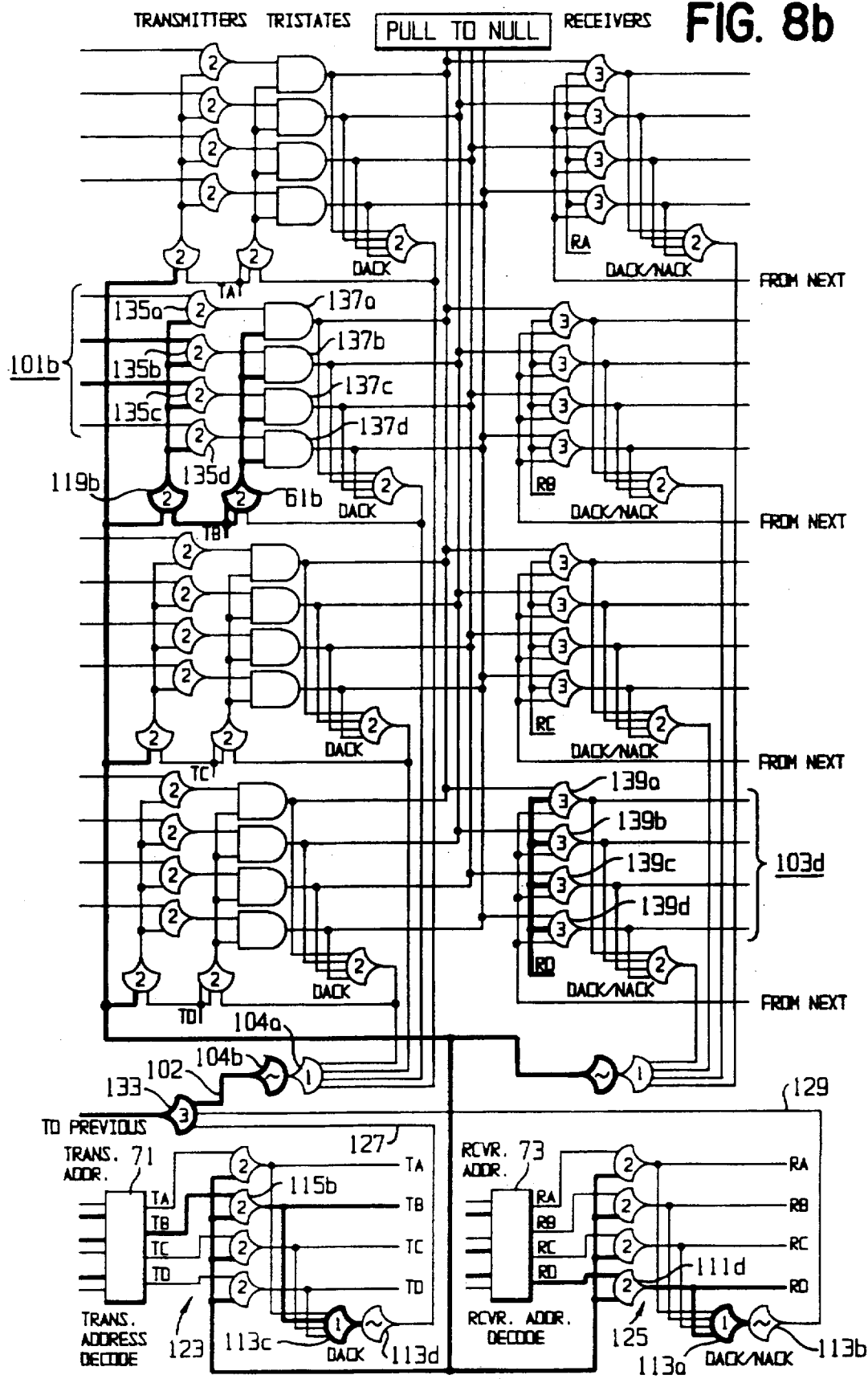

In FIG. 8b, a data wavefront arrives, which consists of: 1) data arriving at transmitter port 101b; 2) a transmitter address arriving at transmitter address decoder 71; and 3) a receiver address arriving at receiver address decoder 73. The data wavefront is blocked at the transmitter register gates 135a, 135b, 135c, 135d.

The transmit address decoder 71 decodes the transmit address and presents the decoded address to the transmitter address register 123. Transmit address register gate 115b now receives two asserted data inputs, and asserts data on transmit address signal line TB. Gate 119b of transmitter port 101b now receives two asserted data inputs and asserts DATA on its output signal line. Gate 61b also now receives two asserted data inputs and asserts DATA on its output signal line. Watcher gates 117a, 117b of transmit address register 123 detect the presence of the address strobe on signal line TB and switch output line 127 to NULL.

The receiver address decoder 73 decodes the receive address and presents the decoded address to receiver address register 125. Receive address register gate 111d now receives two asserted data inputs, and asserts data on receive address signal line RD. Receiver gates 139a, 139b, 139c, 139d of receiver port 103d now receive one asserted data input, but this is less than their threshold and they maintain NULL on their output signal lines. Watcher gates 113a, 113b of receive address register 125 detect the presence of the asserted -address strobe on signal line RD and switch output line 129 to NULL.

Gate 133 (which receives the output from address register watcher gates 117b and 113b) now receives only one asserted data signal from gate; however, the hysteresis characteristic of NULL convention gates causes gate 133 to maintain an asserted DATA output.

The transmitter port 101b is now enabled to pass data to the tristate drivers 137a, 137b, 137c, 137d, which are also enabled. The data wavefront is synchronized with the address strobe at the transmitter register gates 135a, 135b, 135c, 135d.

Figure 8C:
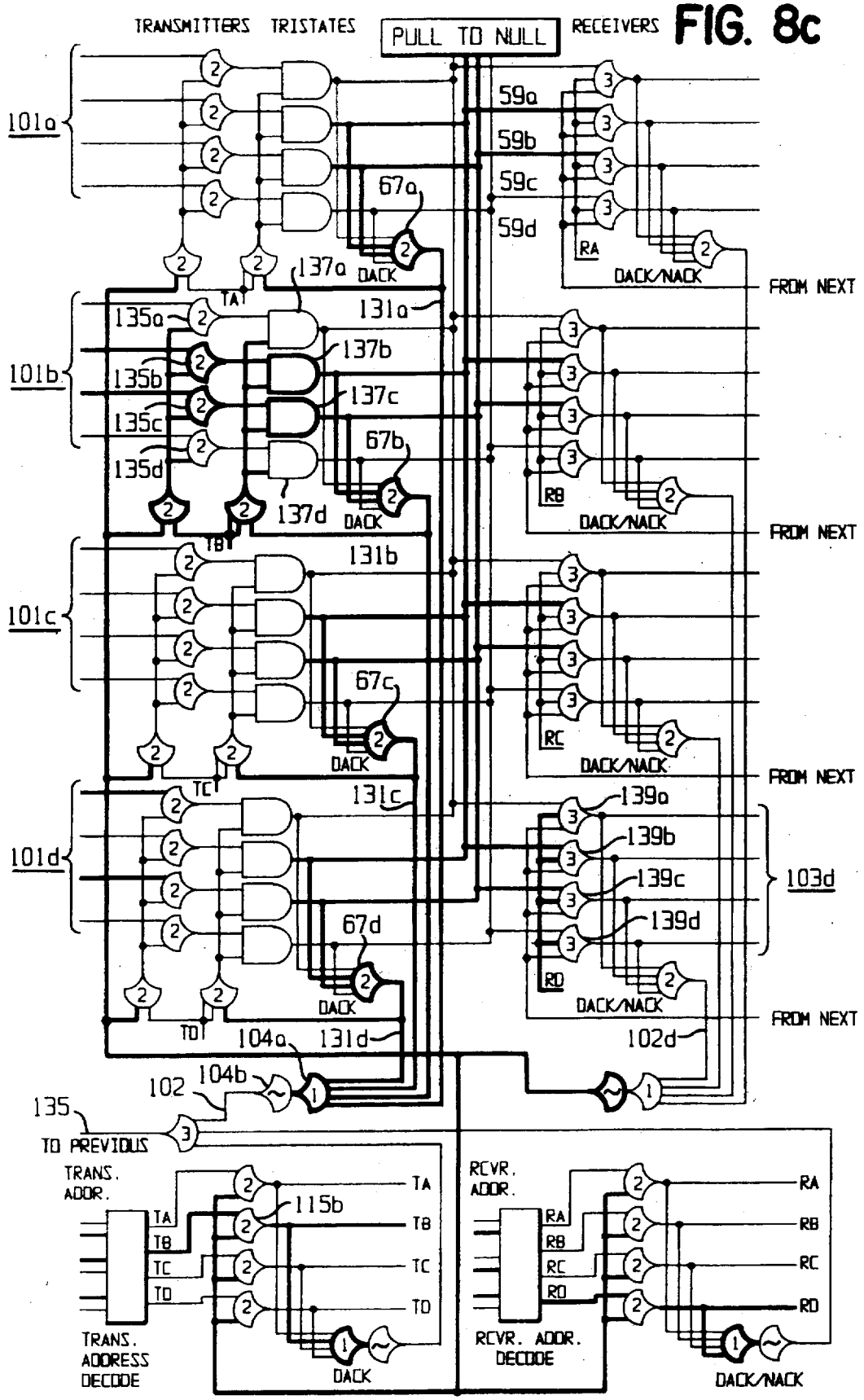

In FIG. 8c, the data wavefront passes through the transmit register gates 135a, 135b, 135c, 135d and through the tristate drivers 137a, 137b, 137c, 137d with full delay insensitivity, appears on the bus conductors 59a, 59b, 59c, 59d and is presented to the watchers 67a, 67b, 67c, 67d. Relative delays in the signals of the data wavefront arriving at the tristate gates do not cause hazards or races. As with the combinational form of the bus, there may optionally be: a single watcher on the bus, locally positioned watchers, or one watcher per port as shown in FIG. 8c.

The data wavefront is presented to the r103d but is 103d but is blocked by receiver gates 139a, 139b, 139c, 139d until they receive an asserted data request from downstream circuitry (not shown). The bus is now locked until the receiver port gets a data request from its next circuit and returns a request back to the transmitter on signal line 102d to the transmitter and address registers to advance to the next part of the DATA/NULL cycle.

The watchers 67a, 67c, 67d for the non-addressed transmitter ports 101a, 101c, 101d have no effect on their registers or on the circuit as a whole. Data can be presented to the non addressed registers, and it is blocked until the transmitter register is addressed.

The asserted DACK/NACK signal lines 131a, 131b, 131c, 131d from the transmitter watchers 67a, 67b, 67c, 67d provide sufficient asserted data inputs to cause gates 104a and 104b to switch and generate NULL on feedback line 135. This transmission on feedback line 135 signals the upstream circuit to present NULL, and thus advance to the NULL portion of the cycle.

Figure 8D:
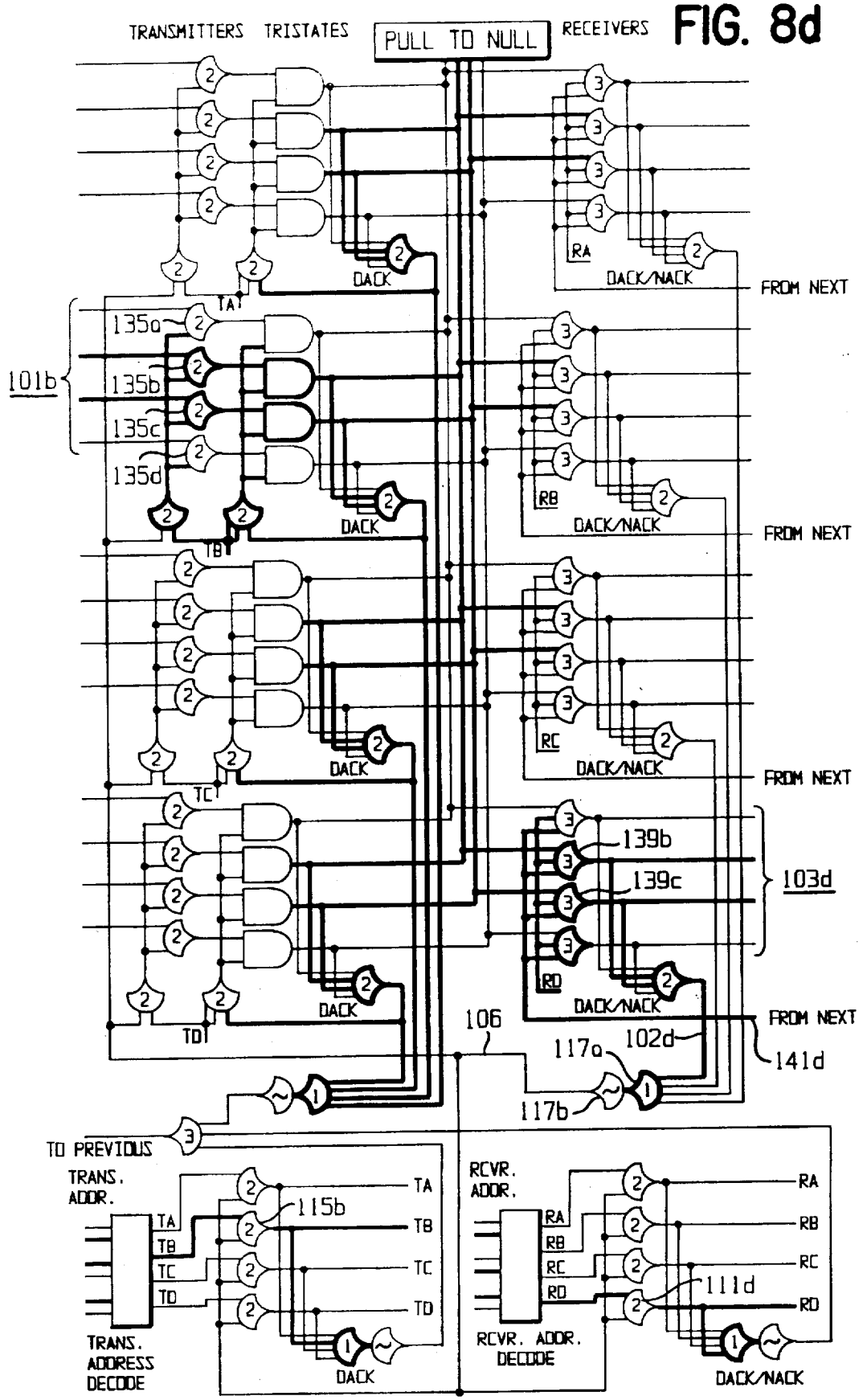

In FIG. 8d, the circuit (not shown) downstream from the receiver port 103 requests data by asserting DATA on the "from next" signal line 141d. The receiver register synchronizes three signal sets: 1) the data wavefront from the bus, 2) the address strobe RD; and 3) the request for data from the next circuit. The receiver gates 139b, 139c now receive three asserted data inputs and pass the data on to the down stream circuit. The watcher gate 108d detects the data wavefront and asserts data on its DACK/NACK signal line 102d. This DATA signal triggers gates 117a, 117b to switch and assert NULL on feedback signal line 106. This NULL signal has no effect on the receiver address register gate 111d because of the gate's hysteresis property, i.e., gate 111d continues to assert DATA. Similarly, transmitter register gate 115b continues to assert DATA on address line TB, and transmitter register gates 135b and 135c continue to assert DATA.

The pipeline bus now is in a stable state awaiting the arrival of the NULL wavefront from upstream circuitry. If the NULL wavefront has already been presented, the transmitter register gates 135a, 135b, 135c, 135d will block it and continue to assert DATA as before. The NULL wavefront is blocked at the transmitter register. The NULL wave front will not pass through the transmitter register and the tristates until after downstream circuitry has requested NULL on line 141d as discussed below.

Figure 8E:
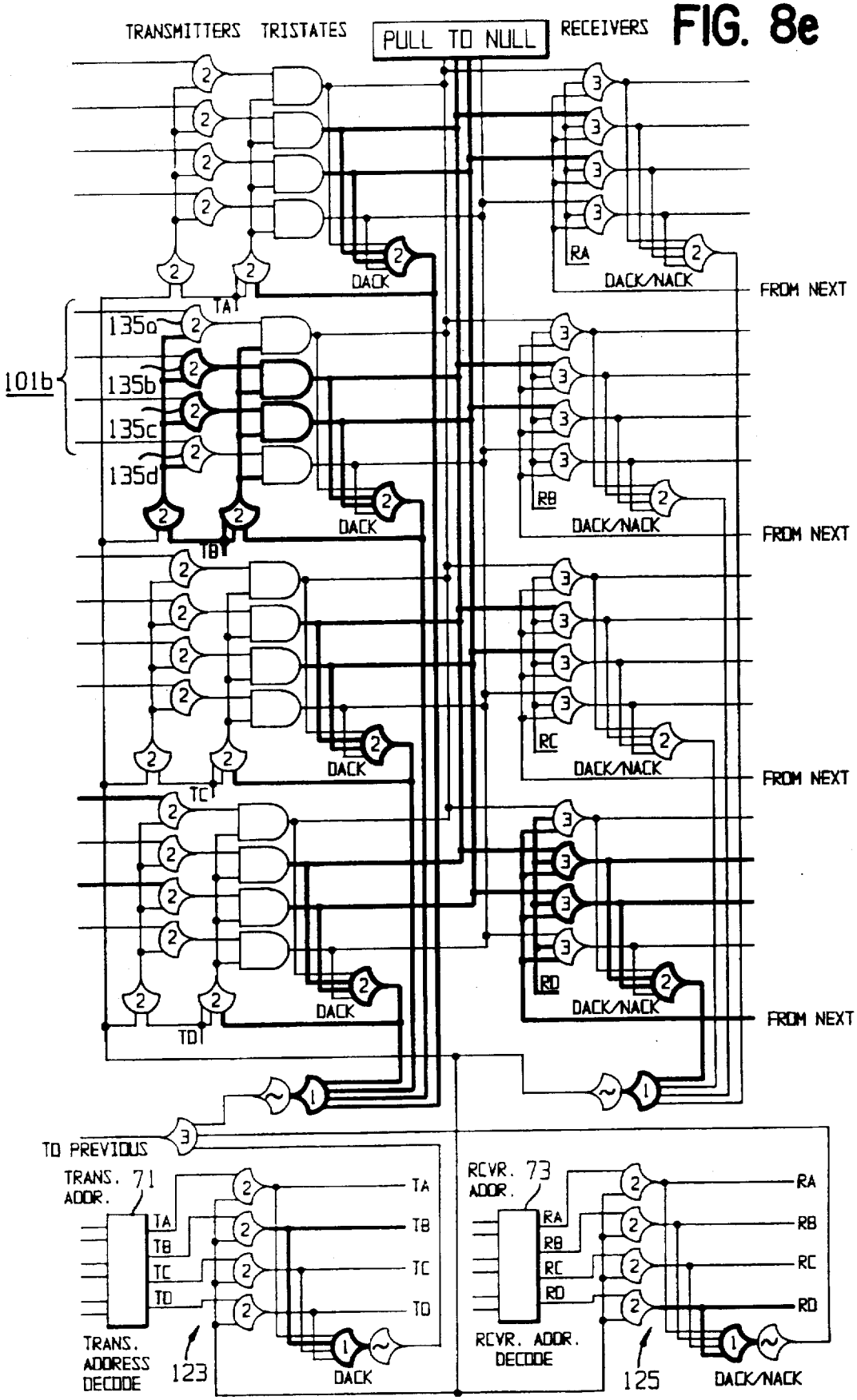

In FIG. 8e, the NULL wavefront arrives at: 1) the transmitter port 101b; 2) at the transmit address decoder 71; and 3) at the receive address decoder 73. In this figure, the inputs to the address registers 123, 125 have returned to NULL but the NULL values have not propagated through to cause address strobe lines TB and RD to return to NULL. The transmitter register gates 135a, 135b, 135c, 135d block the NULL wavefront until the address strobe TB return to NULL.

Figure 8F:
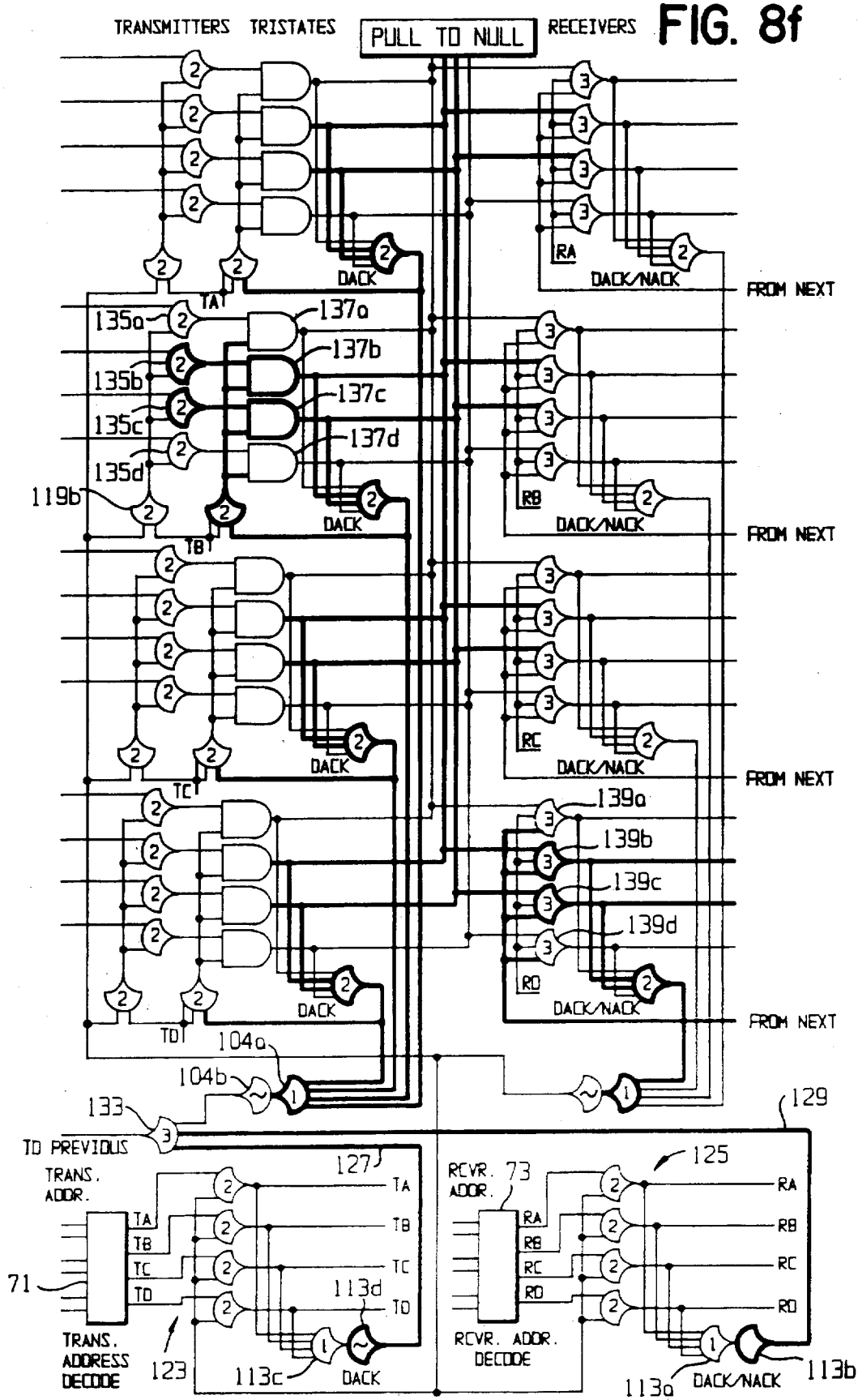

In FIG. 8f, the NULL address lines TB and RD have returned to NULL. The output of transmitter port gate 119b returns to NULL, and all inputs to transmitter register gates 135a, 135b, 135c, 135d are NULL. In this figure, the NULL wavefront has not yet passed through the tristate drivers 137a, 137b, 137c, 137d, and the downstream circuit continues to request data; therefore, receiver gates 139a, 139b, 139c, 139d continue to receive at least one asserted DATA input, and they maintain their previous output states.

In the transmitter address register 123, watcher gate 117a now receives all NULL inputs, and gate 117b asserts DATA on signal line 127. In the receiver address register 125, watcher gate 113a now receives all NULL inputs, and gate 113b asserts DATA on signal line 129. These two asserted DATA signals are not yet enough to cause gate 133 to assert DATA.

Figure 8G:
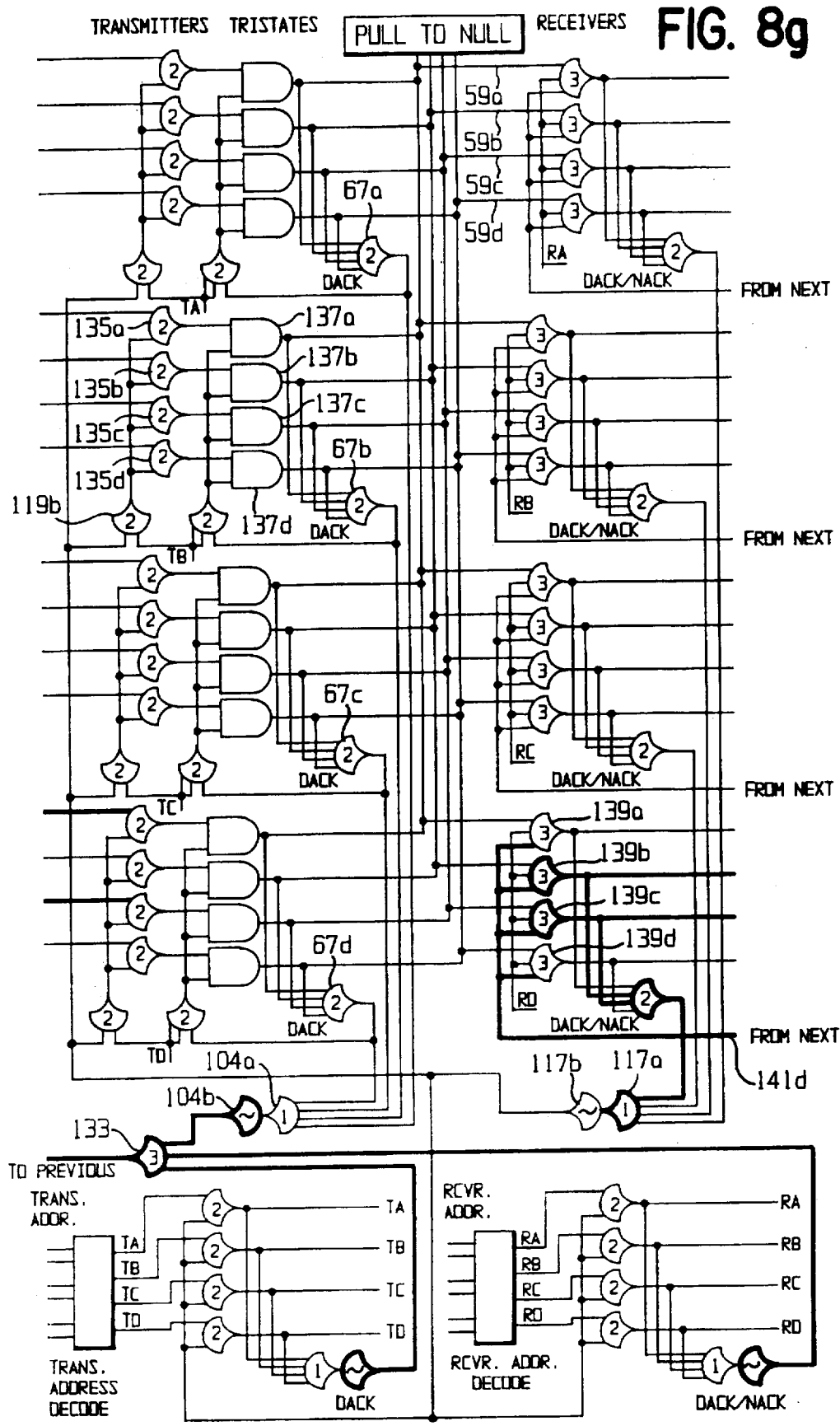

In FIG. 8g, the NULL wavefront passes through the transmitter register gates 135a, 135b, 135c, 135d, through the tristate drivers 137a, 137b, 137c, 137d, and onto the bus lines 59a, 59b, 59c, 59d. The bus watcher 67b detects the NULL wavefront and turns off the tristate drivers 137a, 137b, 137c, 137d for the port. The NULL wavefront is now blocked at the receiver register. The NULL wavefront is blocked at the receiver register gates, whose hysteresis characteristics cause them to maintain their outputs as long as the downstream circuit (not shown) requests data on "from next" signal line 141d.

On the transmitter side, gate 104a now receives all NULL inputs from watchers 67a, 67b, 67c, 67d, and gate 104b asserts DATA on its output. Gate 133, which has a threshold of three, now receives three asserted DATA inputs and asserts its output. This asserted output signals the upstream circuit (not shown) that a data wavefront may now be presented. The bus is prevented from accepting data, however, by operation of gates 117a and 117b, which will continue to lock the bus until the downstream circuit has cleared the receiver gates by signaling for a NULL wavefront.

Figure 8H:
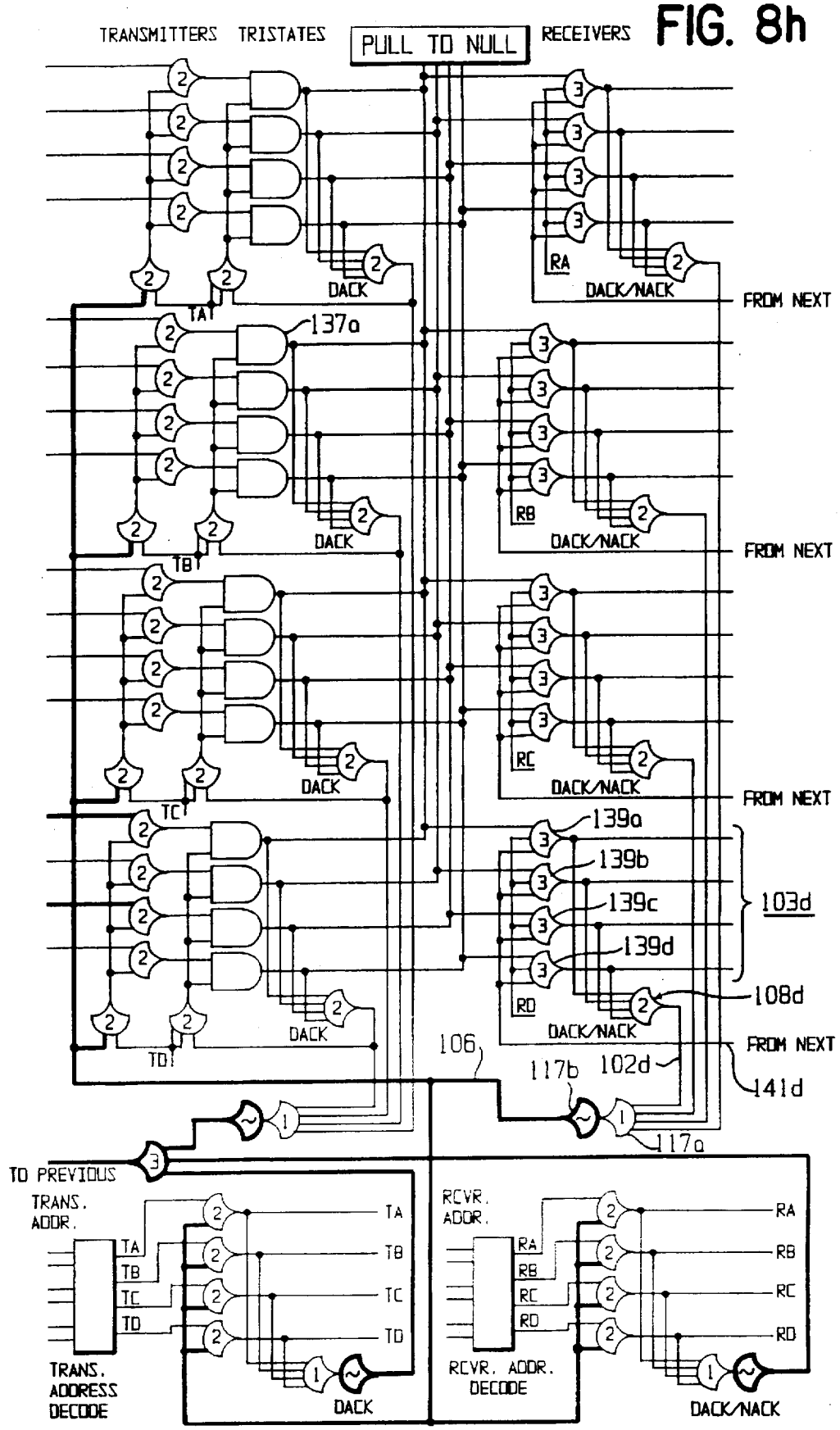

In FIG. 8h, the downstream circuit (not shown) for port 103d requests a NULL wavefront by asserting NULL on "from next" signal line 141d. Receiver gates 139a, 139b, 139c, 139d now have all NULL inputs and assert NULL on their outputs. Watcher gate 108d now receives all NULL inputs and asserts NULL on signal line 102d. Gate 117a now receives all NULL inputs, and gate 117b asserts DATA on signal line 106, which returns the bus to its starting state as shown in FIG. 8a. The bus now may pass through a new cycle of data.

A pipeline bus with receive FIFO buffering

With the bus configuration shown in FIGS. 7 and 8a–8h, the bus is tied up each cycle in the state shown in FIG. 8c or 8g until the downstream circuit requests a next data or NULL wavefront. If the downstream circuit is another synchronous register, the requested wavefront can be immediately accepted from the receive register, thereby freeing the bus to perform another cycle between two different ports. The actual downstream circuit can then request the NULL or data wavefront from the second register when it is ready without holding up other data transfer on the bus.

The receive register and its following register form a FIFO. Two, three or more registers can be added to make this FIFO as long as desired. If the FIFO is full and the associated receive register is addressed, the bus will hang until there is a spot in the FIFO for the next wavefront from the bus. The FIFO depths can be adjusted to maximize the performance of the bus.

Figure 9:
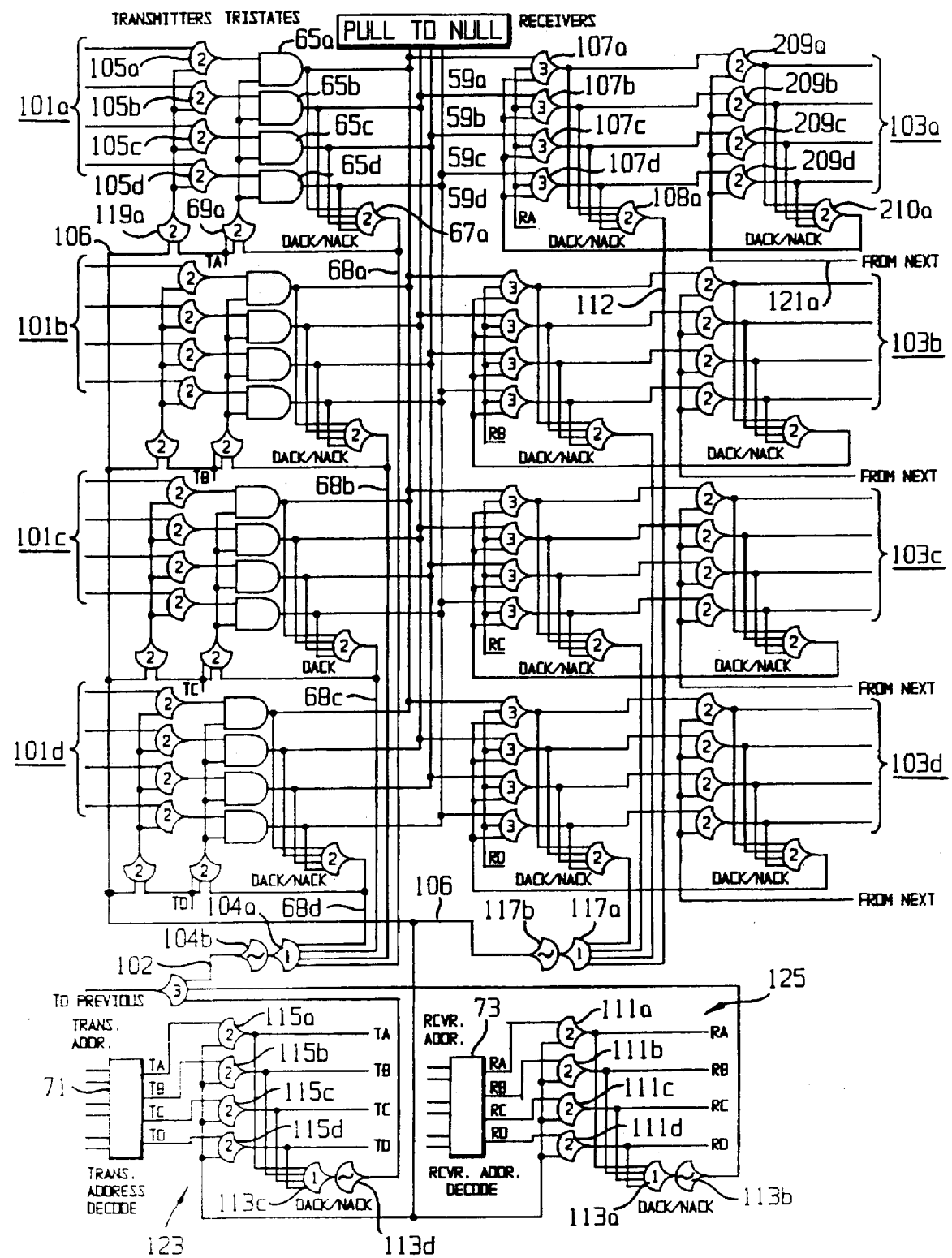
FIG. 9 shows a FIFO-buffered NULL convention logic bus.

FIG. 9 shows such a FIFO buffered bus. It includes all the elements of the pipeline bus described in FIGS. 7, 8a–8h. Receiver port 103a further includes four threshold-two gates 209a, 209b, 209c, 209d and a DACK/NACK monitor gate 210a, configured as an synchronous register and collectively referred to as an output FIFO register 220a. Each of the four threshold two-gates 209a, 209b, 209c, 209d are referred to here as output FIFO register gates. Each output FIFO register gate 209a, 209b, 209c, 209d receives one data input from a corresponding pipeline receiver gate 107a, 107b, 107c, 107d, and each FIFO register gate also receives a DACK/NACK input signal 121a received from downstream circuitry (not shown). The outputs of the output FIFO register gates 209a, 209b, 209c, 209d become data inputs to downstream circuitry (not shown). A DACK/NACK monitor 210a is a is two-of-four gate which monitors the outputs of the four output register gates 209a, 209b, 209c, 209d and provides a feedback signal to the receiver gates 107a, 107b, 107c, 107d. Operation of a pipeline of synchronous registers is described in co-pending U.S. patent application Ser. No. 08/318,508, incorporated here by reference.

A NULL Convention logic Register File

A register file is a system structure that addressably stores temporary data in a system. To deal with the alternating NULL-DATA wavefronts, a NULL convention register file must have an input register stage.

Figure 10:
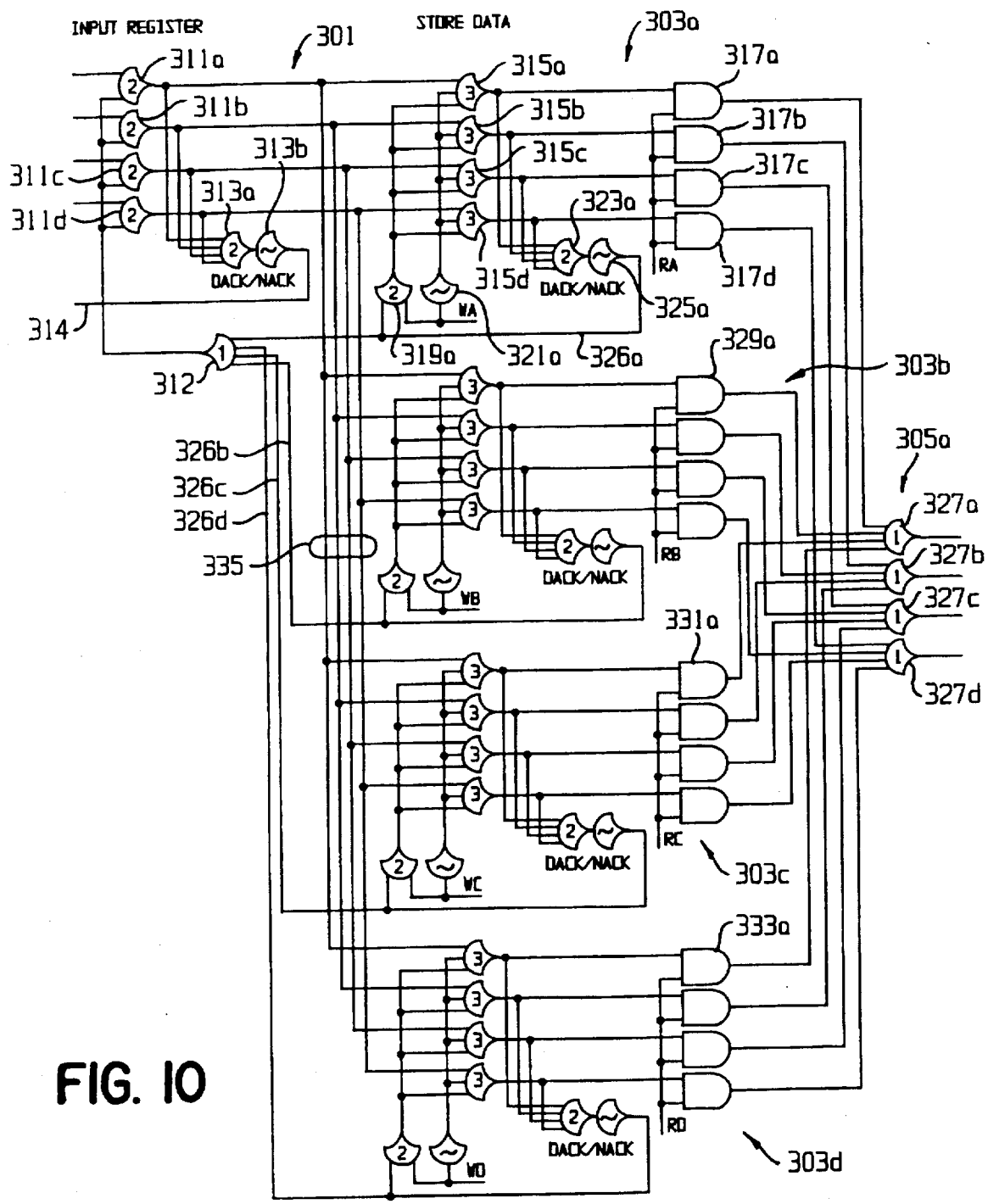
FIG. 10 illustrates a basic configuration of a register file.
Figure 10:
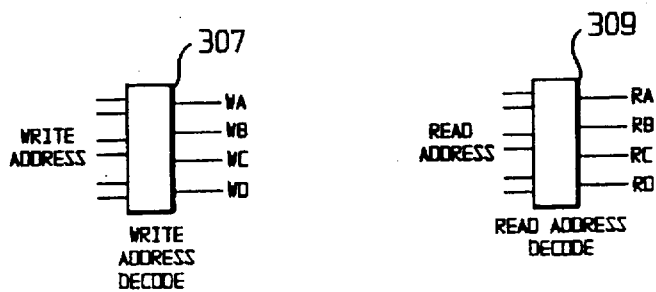

FIG. 10 illustrates a basic configuration of a register file. It includes an input register 301, four storage registers shown generally as 303a, 303b, 303c, 303d; an output interface 305a, a write address decoder 307, and a read address decoder 309.

The input register 301 includes four input gates 311a, 311b, 311c, 311d, a watcher 313a and an associated inverter 313b. Each input gate receives a data input from an upstream circuit (not shown) and an enable input from gate 312. The watcher 313a monitors the four outputs of the input gates 311a, 311b, 311c, 311d, and the inverter 313b provides a DACK/NACK feedback signal 314 to the upstream circuit (not shown).

Storage register 303a includes four register gates 315a, 315b, 315c, 315d, four drivers 317a, 317b, 317c, 317d, two enable gates 319a, 321a, a watcher gate 323a and an associated inverter gate 325a. Each register gate 315a, 315b, 315c, 315d receives one input from a corresponding input gate 311a, 311b, 311c, 311d. Each register gate 315a, 315b, 315c, 315d also receives two enable inputs, one from enable gate 319a and one from enable gate 321a. Enable gate 321a is an inverting gate that asserts DATA when address line WA is NULL, and asserts NULL when address line WA is DATA.

The watcher 323a monitors the four outputs of the register gates 315a, 315b, 315c, 315d, and the inverter 313b provides a DACK/NACK feedback signal 326a to enable gate 319a and to gate 319a. Both enable gates 319a, 321a receive an address input WA from address decoder 307. Each driver 317a, 317b, 317c, 317d receives a data input from a corresponding register gate 315a, 315b, 315c, 315d, and also receives an enable input RA from the read address decoder 309. The other three storage registers 303b, 303c, 303d are essentially the same as the first storage register 303a, except that each receives a distinct write address input WB, WC, WD and a distinct read address input RB, RC, RD.

The read address decoder 307 and the write address decoder 309 both decode a binary address value (e.g., 00, 01, 10, 11) into one of four discrete address lines (e.g., WA for the write address decoder, or RA for the read address decoder). The are substantially identical to the port address decoders of the bus structures 305a described above with reference to FIG. 4.

Output interface 305a includes four output gates 327a, 327b, 327c, 327d. Output gate 327a receives a first input from a driver 317a of storage register 303a, a second input from a driver 329a of storage register 303b, a third input from a driver 331a of storage register 303c, and a fourth input from a driver 333a of storage register 303d. The other three output gates 327b, 327c, 327d are similarly connected to respective drivers of the four storage registers.

Operation of the input register 301, the storage registers 303a, 303b, 303c, 303d, the output interface 305 and the address decoders 307, 309 will be explained with reference to FIGS. 11a–11i and 12a–12c. FIGS. 11a–11i illustrate a write sequence for the elements of the register file, and FIGS. 12a–12c illustrate a read sequence. Narrow lines indicate wires asserting NULL (0V). Wide (heavy) lines indicate wires asserting DATA (5V). Circuit elements that are identical to those illustrated in FIG. 10 will be given identical reference numerals. A read and write operation for storage register 303a will be described. Drawings will emphasize the input register and storage registers 303a and 303b. Storage registers 303c and 303d, which are not addressed, will operate similarly to storage register 303b (which also is not addressed). It should be understood that output interface 305 will pass through the data from the addressed storage register.

Figure 11A:
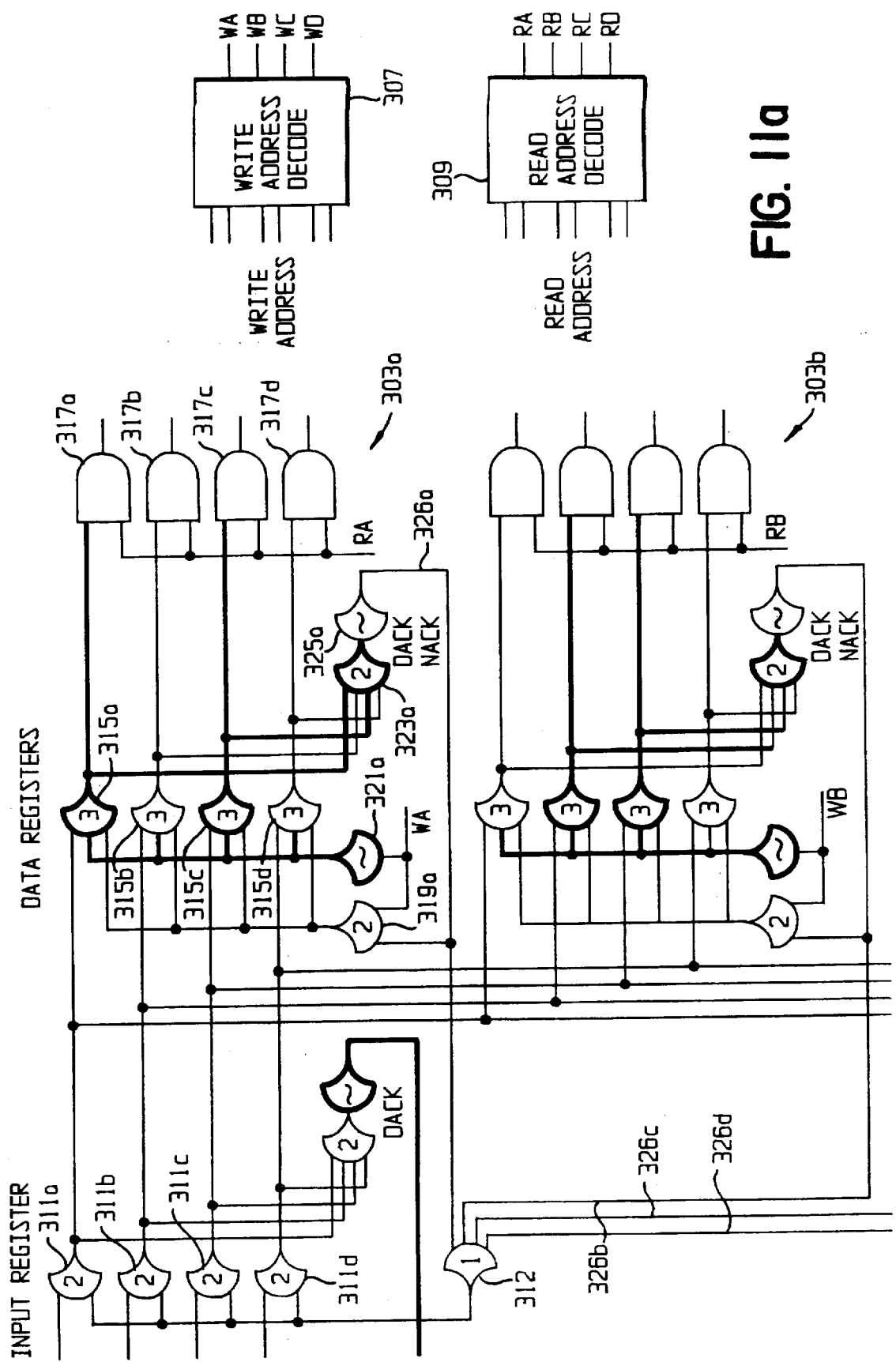
FIGS. 11a–11i illustrate a write sequence for elements of the register file of FIG. 10.
Figure 12B:
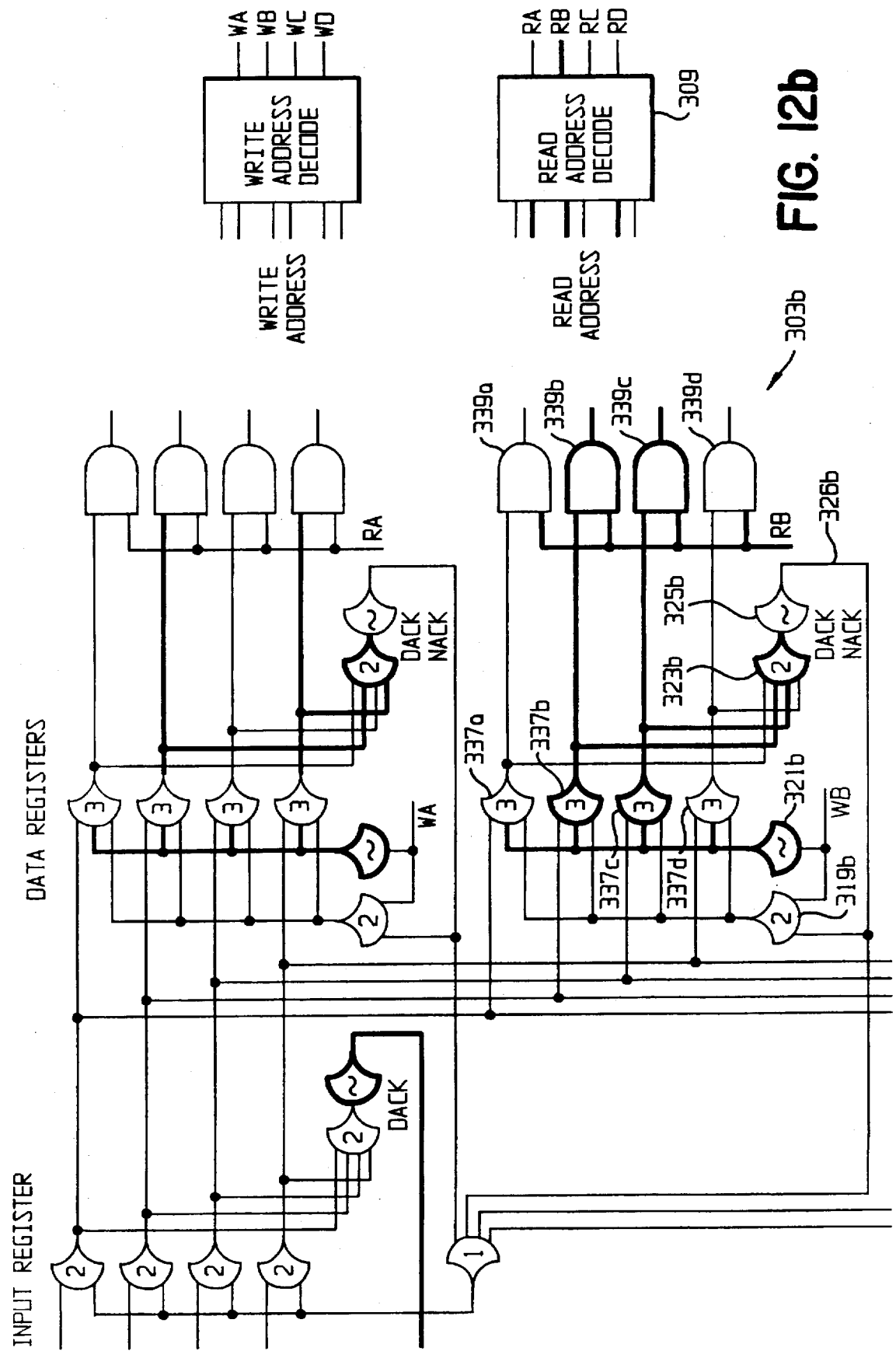
Figure 12C:
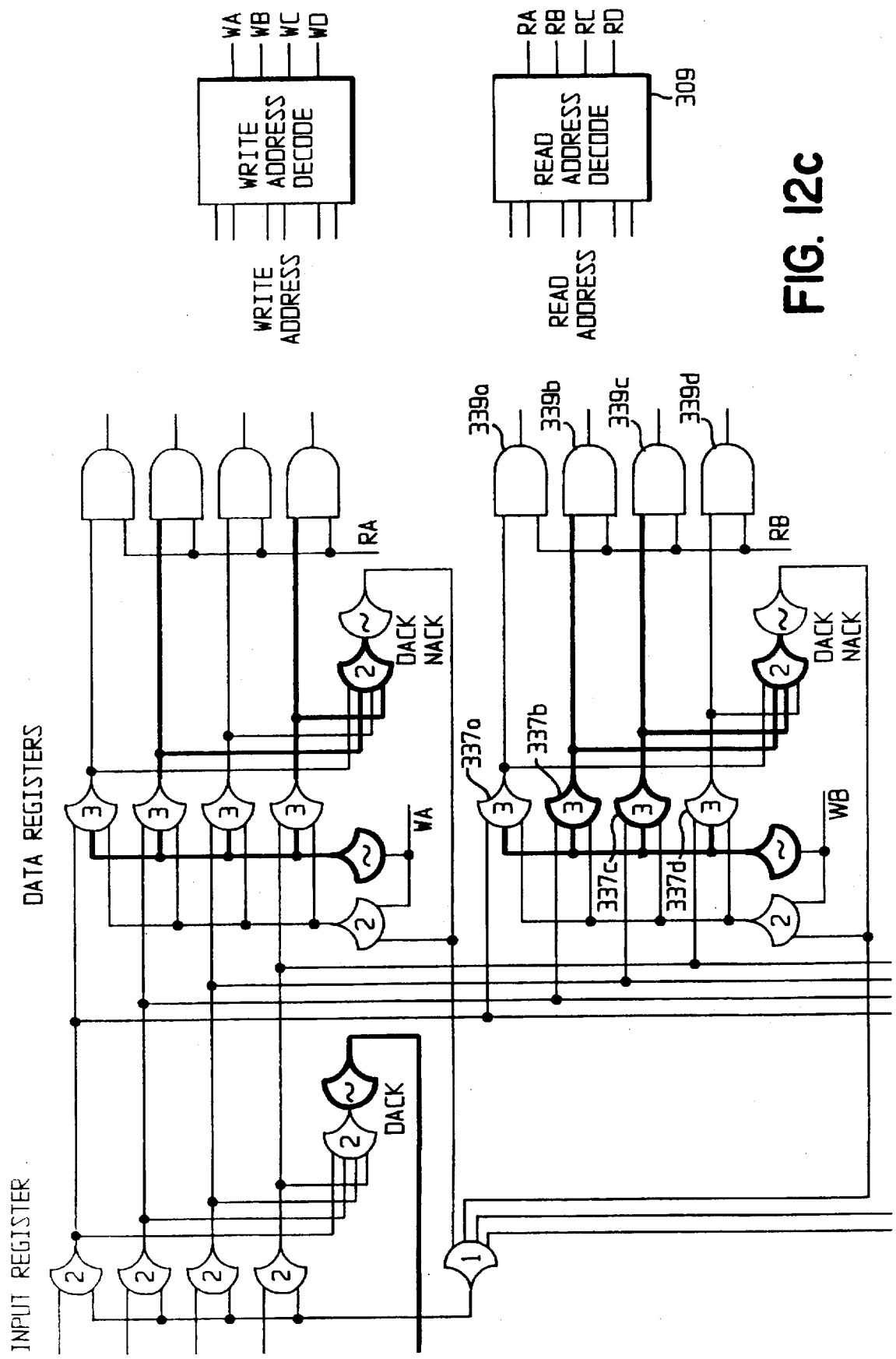

In FIG. 11a, the circuit is in a stable state awaiting a data wavefront. Write address decoder 307 and read address decoder 307 both receive NULL inputs, and all address lines WA, WB, WC, WD, RA, RB, RC, RD are NULL. Enable gate 321a (an inverting gate) receives NULL on address line WA and asserts DATA, thereby holding register gates 315a, 315b, 315c, 315d in their previous states, i.e., storing data as written in a previous cycle. Watcher gate 323a detects the presence of data, and it associated inverter 325a asserts NULL on DACK/NACK signal line 326a. Enable gate 319a receives two NULL inputs and asserts a NULL output. Gate 312 receives the NULL DACK/NACK signal on line 326a, and also receives NULL signals from lines 326b, 326c, 326d from the other storage registers 303b, 303c, 303d. Gate 312 generates a NULL output. Input gates 311a, 311b, 311c, 311d receive the NULL output from gate 312, and each receives a NULL signal from upstream circuitry (not shown). All four input gates 311a, 311b, 311c, 311d have NULL outputs. Drivers 317a, 317b, 317c, 317d receive NULL on signal line RA and assert NULL outputs to output interface 305a. The other three storage registers 303b, 303c, 303d are in essentially the same states, except that each may be storing unique data.

Figure 11B:
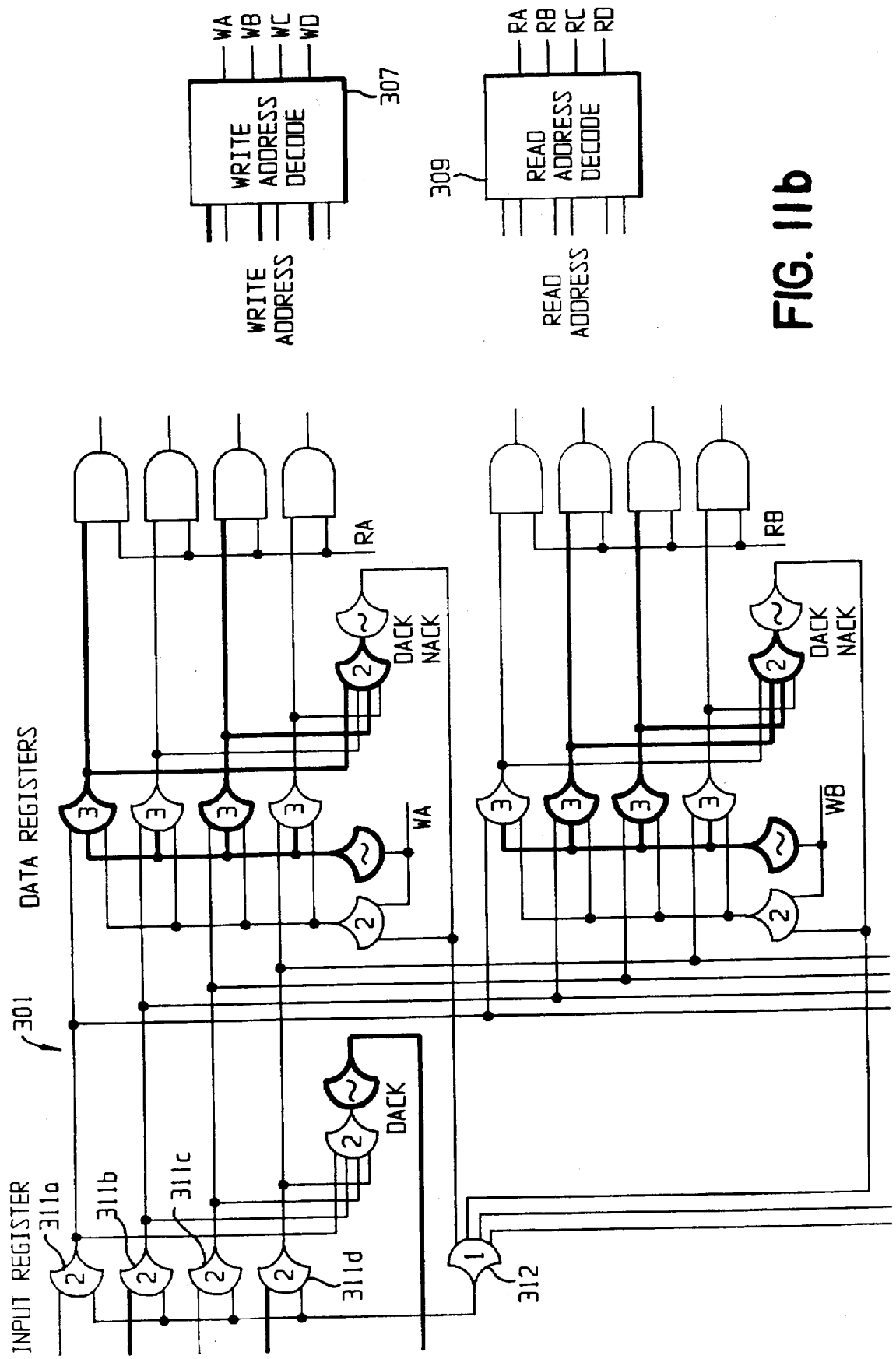

In FIG. 11b, a DATA wavefront arrives, which consists of: 1) data arriving at input register 301; and 2) a write address arriving at transmitter address decoder 307. The data wavefront will not pass through the input register 301, because enable gate 312 provides one NULL input to input gates 311a, 311b, 311c, 311d.

Figure 11C:
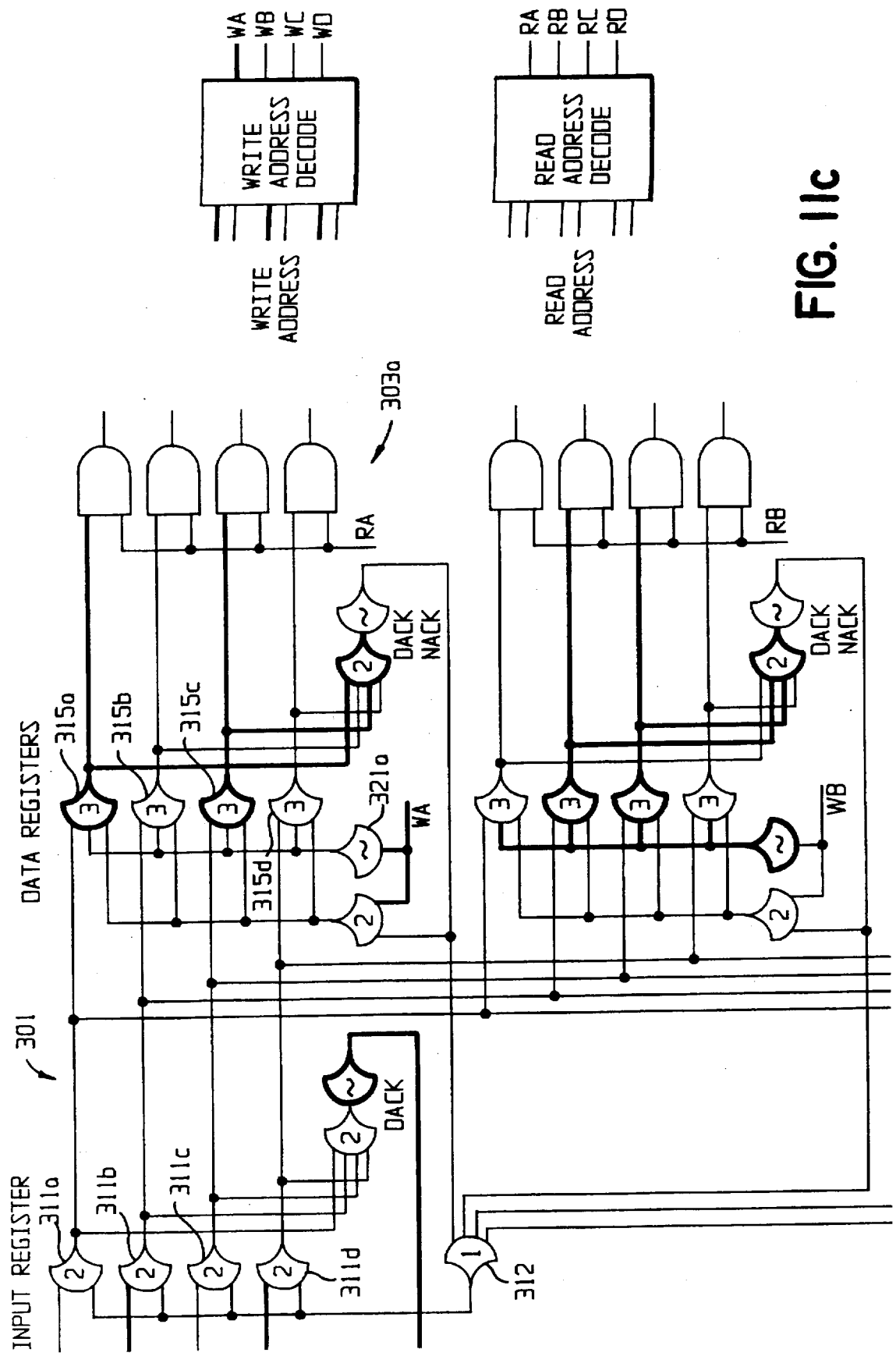

In FIG. 11c the write address decoder asserts DATA on address line WA. In storage register 303a (the addressed register), inverting enable gate 321a generates a NULL signal. The data wavefront is still blocked at the input register 301, however, input gates are presenting NULL to the storage gates 315a, 315b, 315c, 315d. These NULL signals, in combination with the NULL output from inverting gate 321a will cause storage gates 315a, 315b, 315c, 315d to switch to NULL, thus clearing register 303a.

Figure 11D:
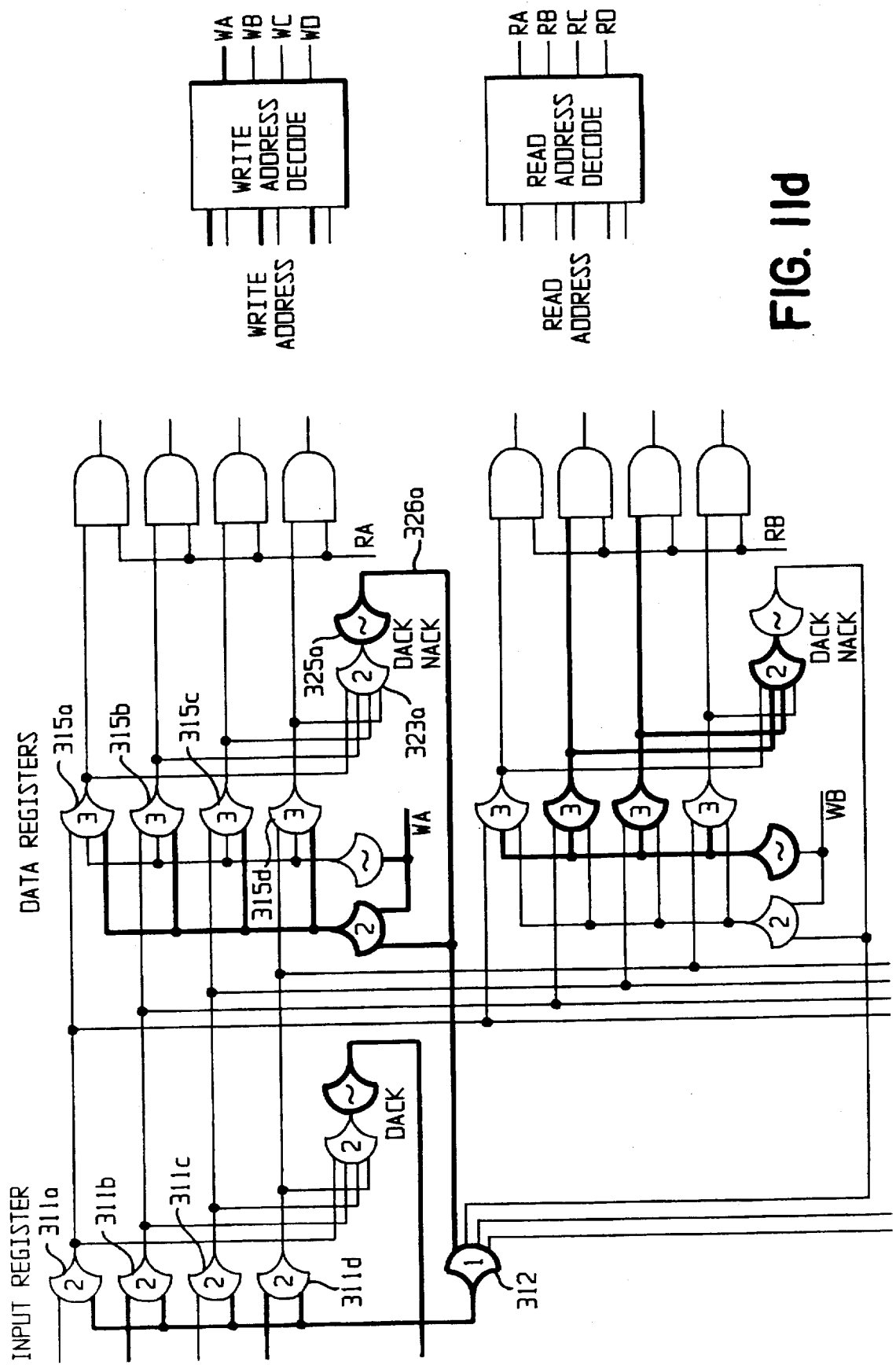

In FIG. 11d, storage gates 315a, 315b, 315c, 315d have been cleared. The watcher gate 323a receives all NULL inputs, and its associated inverting gate 325a asserts DATA on signal line 326a. This DATA signal plays through gate 312, which will enable input gates 311a, 311b, 311c, 311d to store the data wavefront.

Figure 11E:
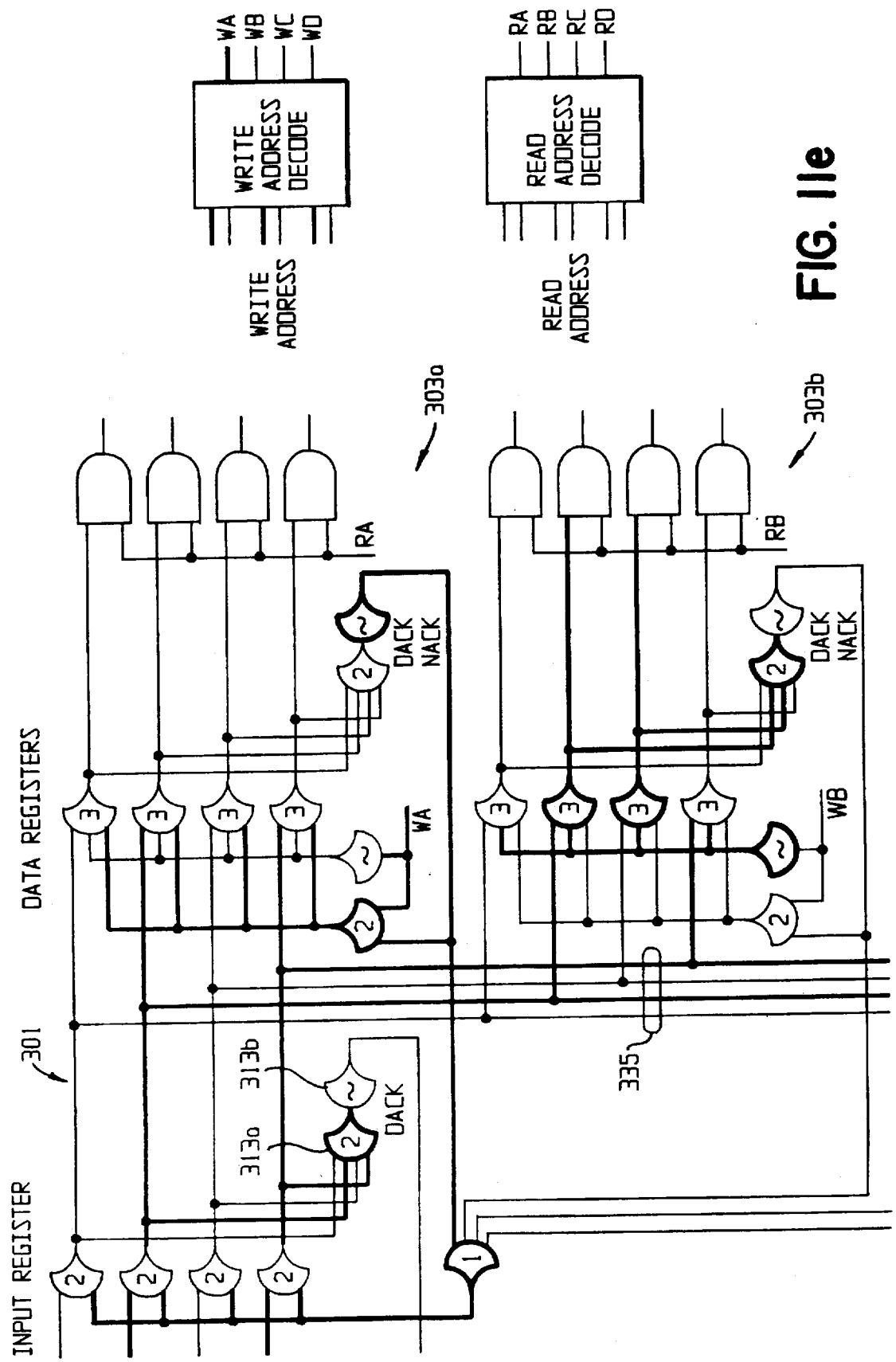

In FIG. 11e, the input register 301 stores the DATA wavefront and presents it to the data register 303a over the internal bus 335. Watcher gate 313a detects the presence of the data wavefront, and its associated inverting gate 313b generates a NULL output. This NULL output signals the upstream circuit (not shown) to present a NULL wavefront.

None of the non-addressed storage registers 303b, 303c, 303d are affected by the data presented on the internal bus 335, because none of the thresholds of the other register gates are met. The circuit is in a stable state awaiting the arrival of the NULL wavefront.

Figure 11F:
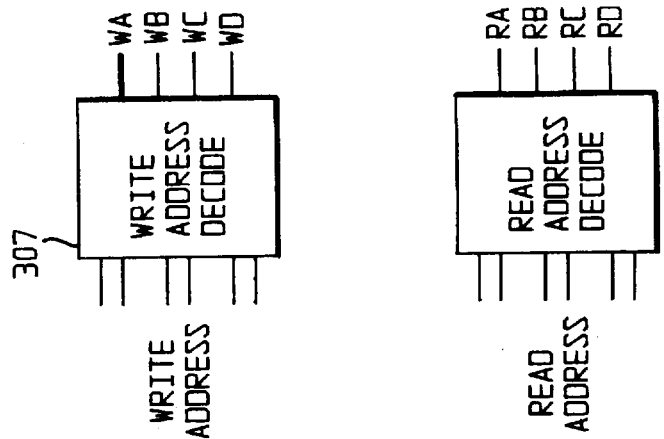
Figure 11F:
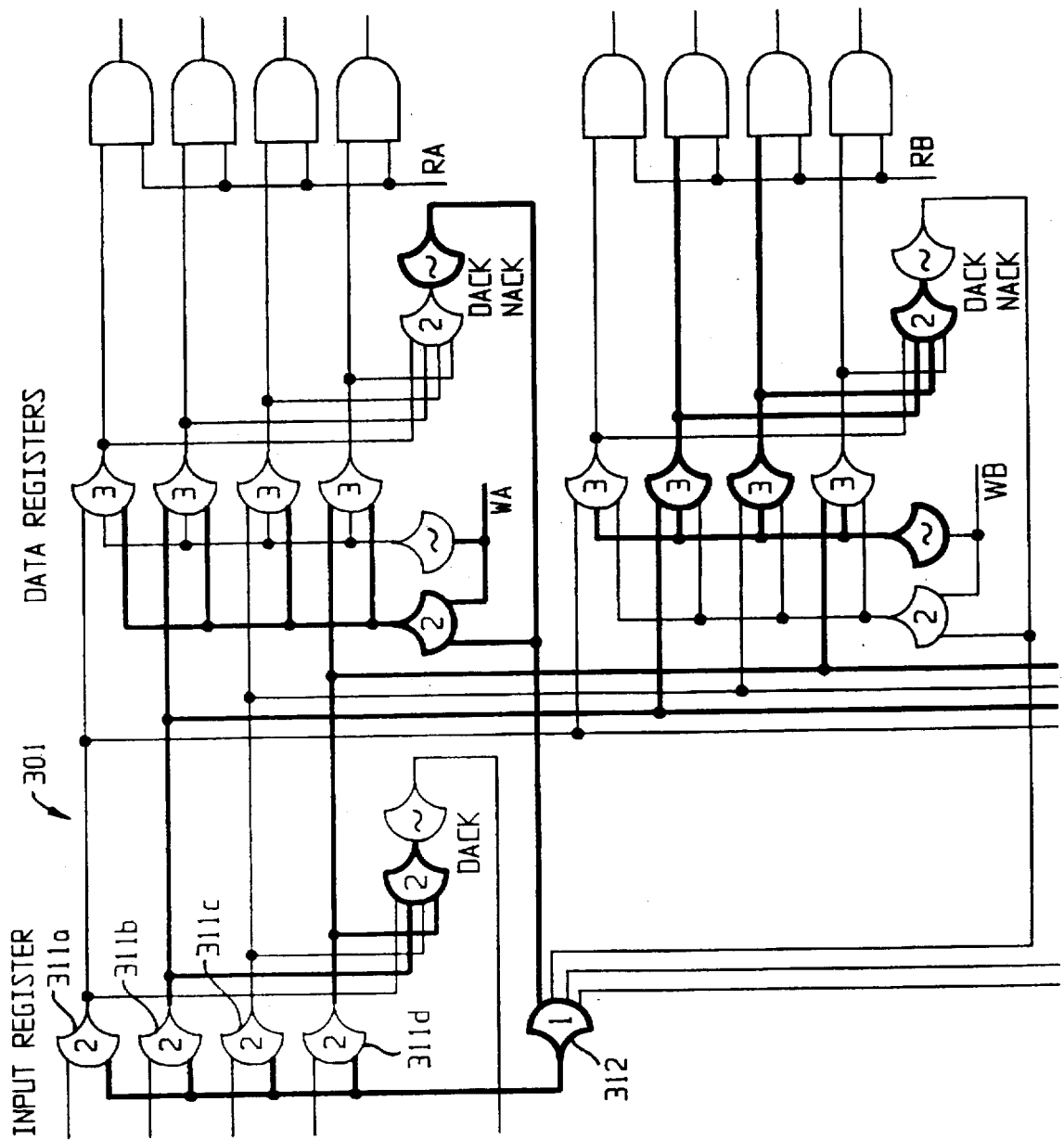

In FIG. 11f, a NULL wavefront arrives from the upstream circuit (not shown) at the input register 301 and at the write address decoder 307. The input gates 311a, 311b, 311c, 311d maintain their outputs (DATA or NULL), because gate 312 continues to provide an asserted DATA input.

Figure 11G:
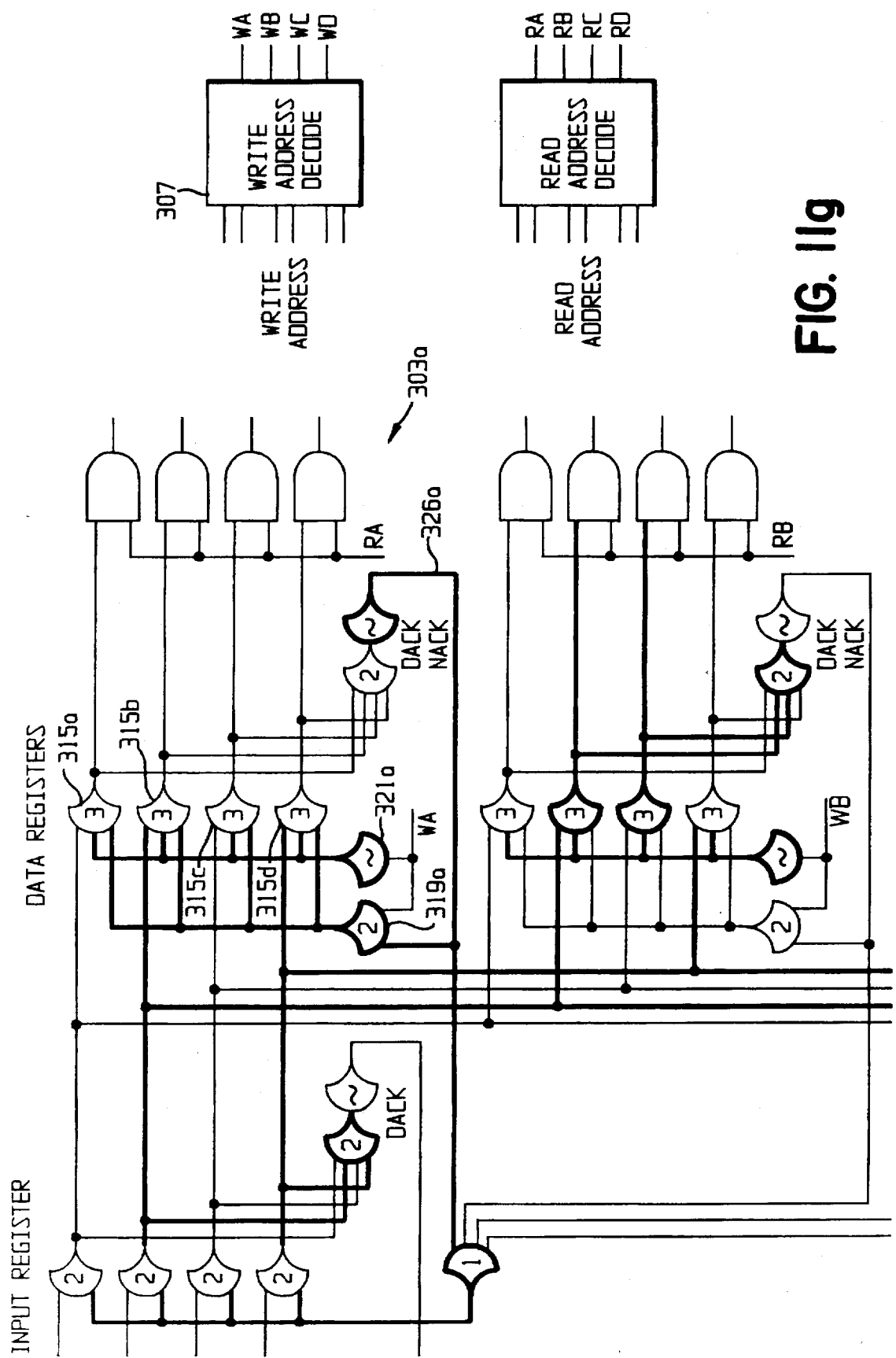

In FIG. 11g, write address decoder 307 returns write address line WA to NULL. In storage register 303a, enable gate 319a maintains its asserted DATA output, because DACK/NACK signal line 326a remains asserted. Inverting gate 321a asserts DATA to the four storage gates 315a, 315b, 315c, 315d which will enable them to store the data wavefront.

Figure 11H:
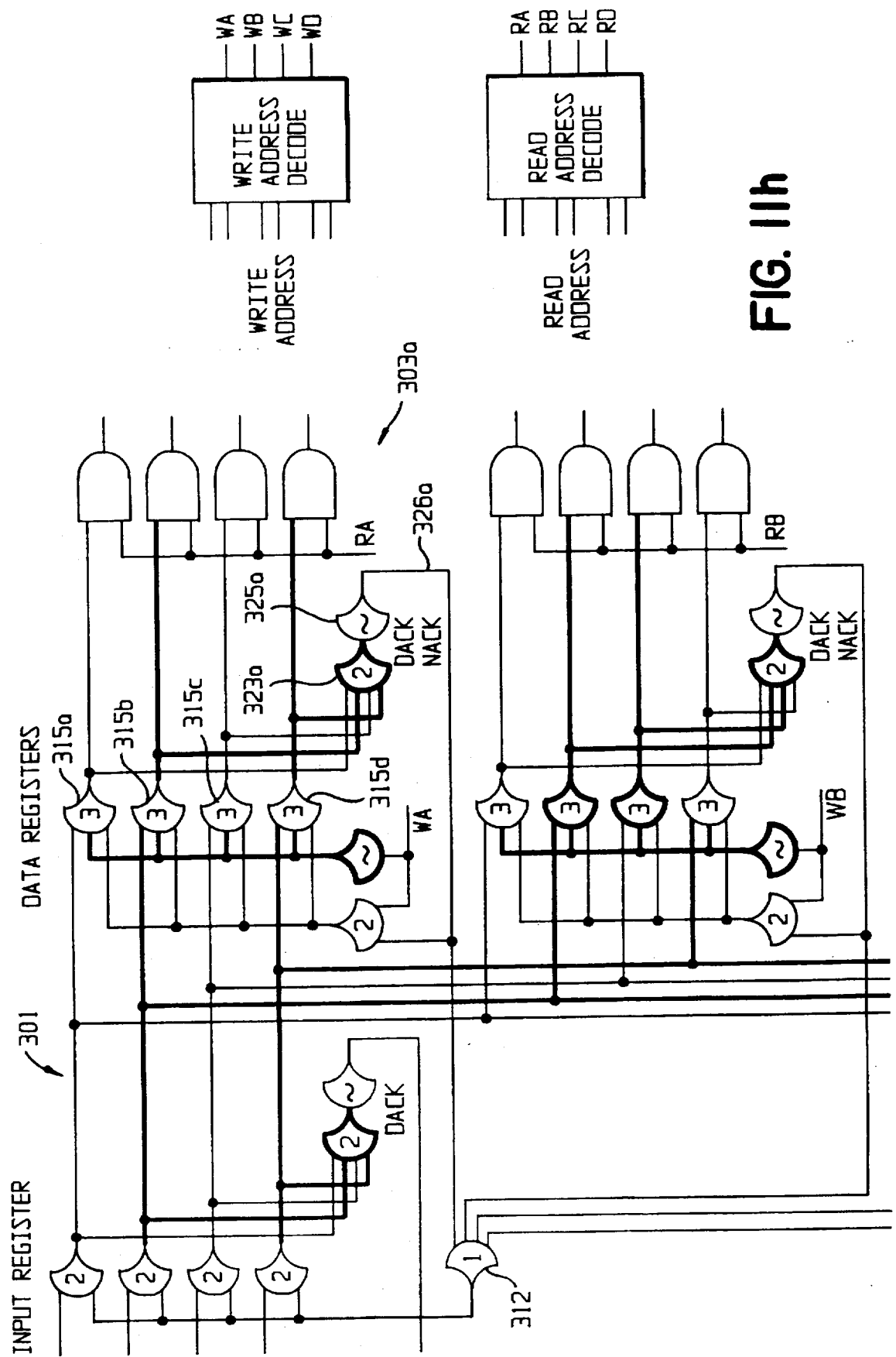

In FIG. 11h, storage gates 315a, 315b, 315c, 315d store the data wavefront. The watcher 323a detects the data at the outputs of the storage gates 315a, 315b, 315c, 315d, and its associated inverting gate 325a asserts NULL on feedback line 326a. This NULL signal passes through gate 312, which switches its output to NULL. Input register 301 will now be enabled to store the NULL wavefront previously received from upstream circuitry (not shown).

Figure 11I:
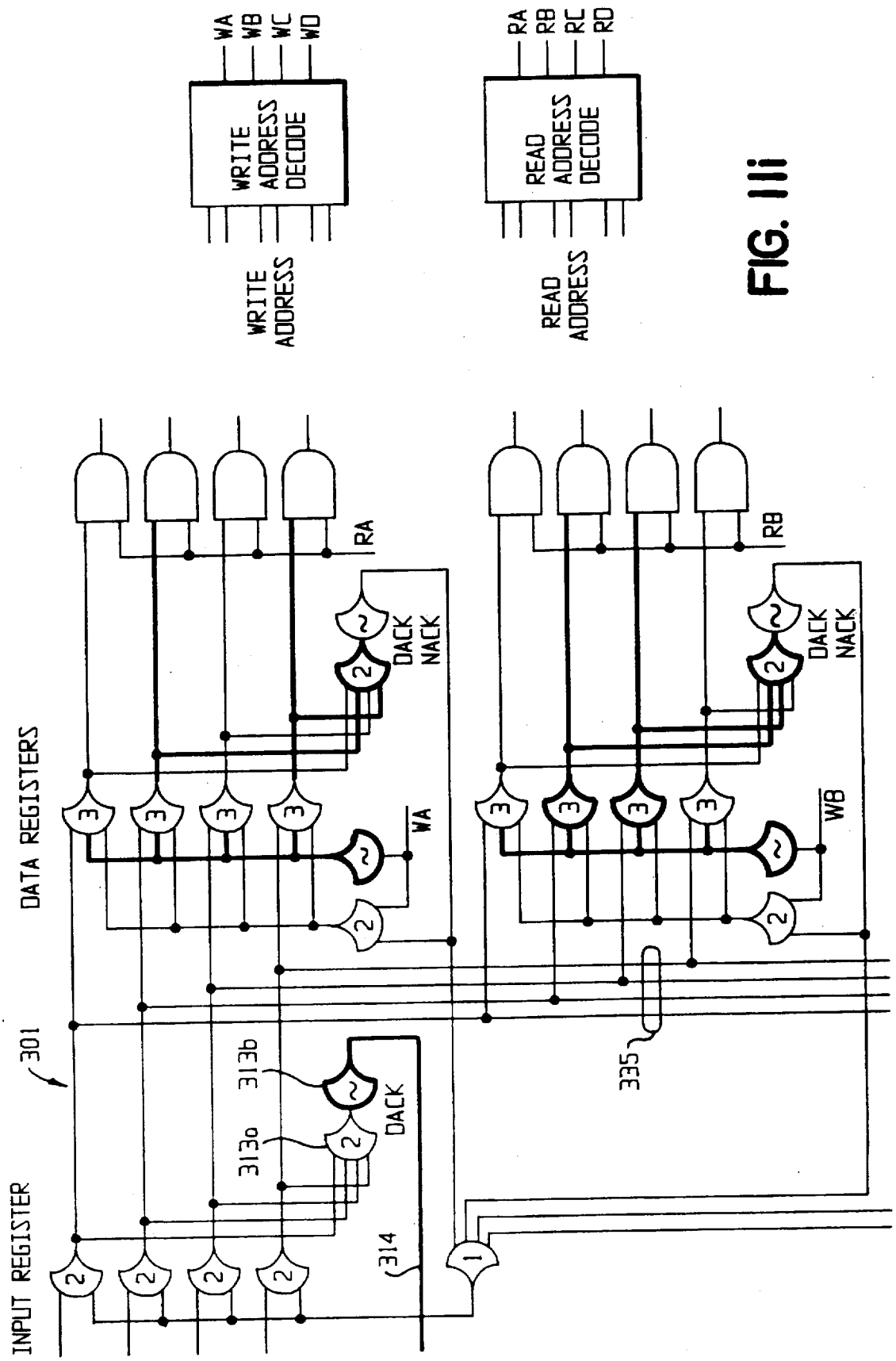

In FIG. 11i, the input register 301 stores the NULL wavefront an presents NULL to the internal bus 335. The watcher gate 313a detects the NULL wavefront, and its associated inverting gate 313b asserts DATA on DACK/NACK feedback line 314, thereby requesting a new DATA wavefront from the upstream circuit (not shown).

The data values have been stored in the register selected by the write address in one DATA-NULL cycle. The circuit has returned to the stable state of FIG. 11a (except that new data has been stored) and the register file awaits the next DATA-NULL cycle.

It should be understood that data may be stored in any of the register files in a similar manner by providing write address decoder 307 with the appropriate binary address. It should also be understood that the presence of data on the internal bus will have no effect on a storage register that is not addressed.

FIGS. 12a–12c illustrate a read sequence for the register file. It will be assumed that the circuit begins in the stable state shown in FIG. 11i. In FIG. 12a, data has already been stored in storage gates 337a, 337b, 337c, 337d of register 303b. Enable gate 321b asserts DATA, because it initially receives NULL on address line WB. Watcher gate 323b detects the presence of data, and its associated inverting gate 325b asserts NULL on signal line 326b. Enable gate 319b asserts NULL, because it receives all NULL inputs (NULL from address decoder line WB and NULL from watcher inverting gate 325b) Drivers 339a, 339b, 339c, 339d receive one NULL input from read address line RB, and their outputs are NULL.

Also shown in FIG. 12a, a binary address is presented to read address decoder 309. Here, the example is an address for storage register 303b.

In FIG. 12b, the read address decoder 309 decodes the binary address and asserts DATA on read address line RB. Drivers 339a, 339b, 339c, 339d become enabled, and allow data from the storage gates 337a, 337b, 337c, 337d to pass to output interface 305 (FIG. 10). The data passing through the drivers may be thought of as a continuation of the data wavefront started with the binary write address. A downstream circuit will detect the data wavefront continuing from the selected register.

In FIG. 12c, a NULL wavefront is presented in the form of a NULL address presented to the read address decoder 309. Read address decoder 309 asserts NULL on read address line RB, and the drivers 339a, 339b, 339c, 339d again assert NULL and isolate the storage gates 337a, 337b, 337c, 337d from the output interface 305 (FIG. 10). This assertion of NULL may be thought of as a continuation of the NULL wavefront started with the NULL write address.

It should be understood that any of the storage registers can be accessed by selecting the appropriate binary address. It should also be understood that write cycles and read cycles can occur simultaneously, but that a register that is being written cannot be read in the same cycle.

A Register File with Dual Output Ports

Figure 13:
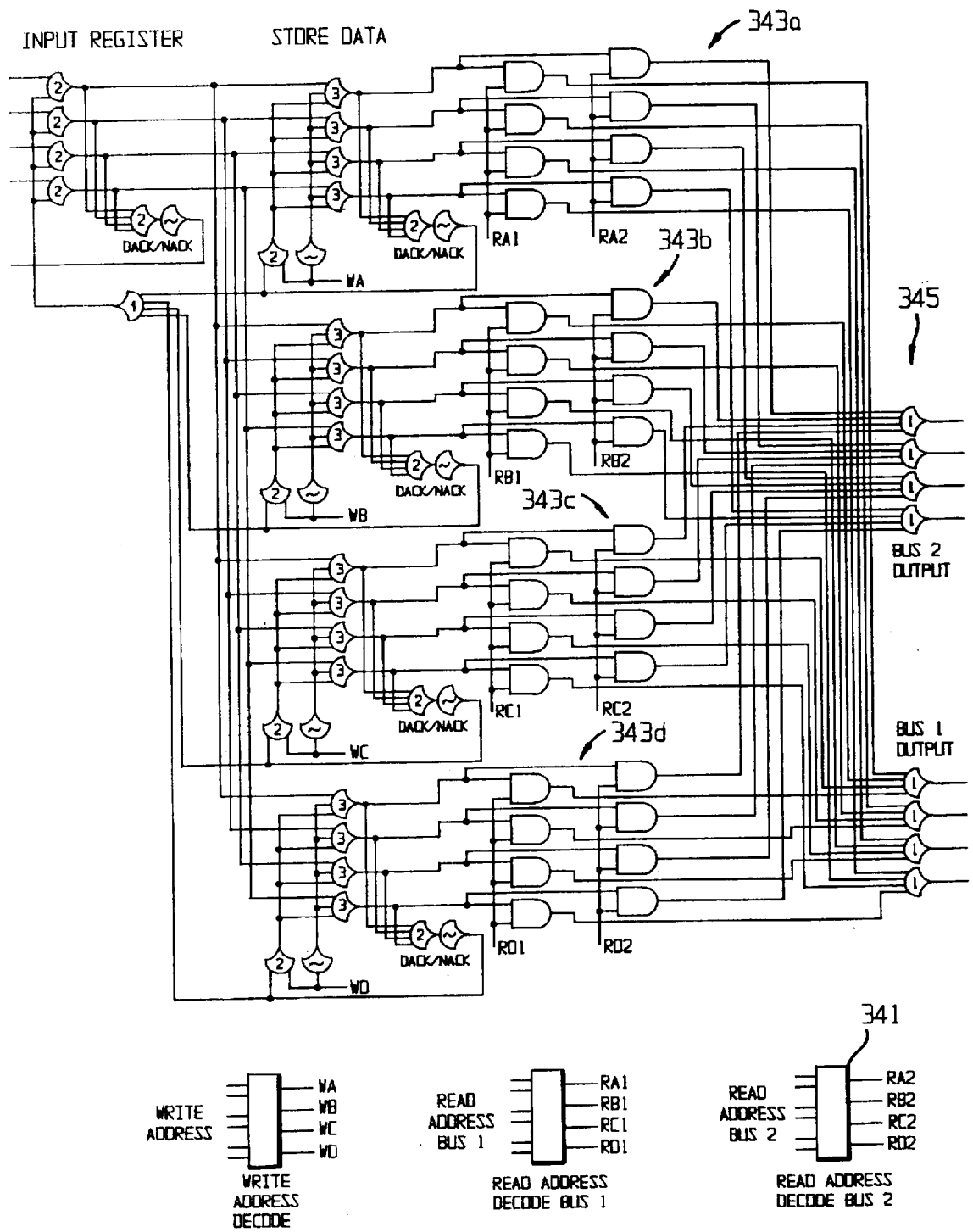
FIG. 13 illustrates a multi-port register file.

A modification to the circuit of FIG. 10 provides dual output ports for the register file. It requires another address decoder 341 and another rank of drivers 343a, 343b, 343c, 343d connected in parallel with the first drivers (e.g., 317a–317d, 339a–339d) forming another output bus 345 as shown in FIG. 13.

After learning of the embodiments described above, people practicing in this art will be able to make variations that fall within the spirit and scope of the invention. The embodiments described above are exemplary but not intended to limit unduly the scope of the invention as defined by the following claims.

Address decoder

Figure 14:
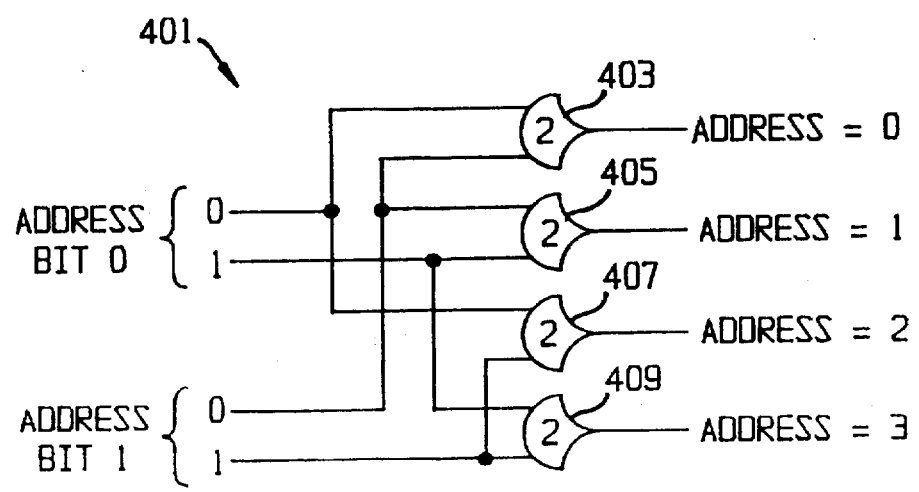
FIG. 14 illustrates a NULL convention decoder.

FIG. 14 illustrates a two-to-four NULL convention decoder suitable for use as an address decoder in the examples of logic busses and register files described above. The decoder 401 includes four threshold-two gates 403, 405, 407, 409. The output of gate 403 is a first address line, the output of a second gate 405 is a second address line, etc. The inputs are selected from the binary input address to activate each line in response to the appropriate input signal pattern.

It will be appreciated that decoders with higher numbers of inputs and outputs can be made by adding additional gates, wiring them appropriately to the input signals, and changing threshold values if necessary.

What is claimed is:

1. An addressable NULL convention register file for storing NULL convention signals, said NULL convention signals having at least a first data value signifying data and a NULL value which has no data significance, said register file comprising:

an input register receiving, storing, and propagating alternating wavefronts of NULL and data values;

a first storage register connected to receive and store data and NULL values in alternate succession from the input register and having data outputs indicating stored data and NULL values;

a second storage register connected to receive and store data and NULL values from the input register and having data outputs indicating stored data and NULL values; and an address generating circuit generating an enable signal selectively enabling one of the first and second storage registers;

wherein an enabled one of the storage registers stores data values propagated from the input register while enabled.

2. The register file of claim 1 wherein:

the input register propagates a wavefront of NULL values to an enabled storage register when the enabled storage register data outputs assert meaningful data values, and the input register propagates meaningful data values to an enabled storage register when the enabled storage register outputs NULL values.

3. The register of claim 1 wherein each storage register connects to the input register through NULL convention signal lines, at least some NULL convention signal lines comprising a plurality of electrical conductors, each electrical conductor assuming one of two voltage levels.

4. The register of claim 1 wherein each storage register connects to the input register through NULL convention signal lines, at least one NULL convention signal line comprising one electrical conductor assuming at least three voltage levels.

5. An addressable asynchronous register file for storing NULL convention signals, said NULL convention signals having at least a first data value signifying data and a NULL value which has no data significance, said register file comprising:

an input register receiving, storing, and propagating alternating wavefronts of NULL and data values;

a first storage register connected to receive and store data and NULL values in alternate succession from the input register and having data outputs indicating stored data and NULL values;

a second storage register connected to receive and store data and NULL values from the input register and having data outputs indicating stored data and NULL values; and an address generating circuit generating an enable signal selectively enabling one of the first and second storage registers;

wherein an enabled one of the storage registers stores data values propagated from the input register while enabled, and wherein the input register comprises a asynchronous register, said asynchronous register including plurality of a threshold gates.

6. An addressable asynchronous register file for storing NULL convention signals, said NULL convention signals having at least a first data value signifying data and a NULL value which has no data significance, said register file comprising:

an input register receiving, storing, and propagating alternating wavefronts of NULL and data values;

a first storage register connected to receive and store data and NULL values in alternate succession from the input register and having data outputs indicating stored data and NULL values;

a second storage register connected to receive and store data and NULL values from the input register and having data outputs indicating stored data and NULL values;

an address generating circuit generating an enable signal selectively enabling one of the first and second storage registers;

wherein an enabled one of the storage registers stores data values propagated from the input register while enabled, and wherein at least one of first and second said storage registers comprise an asynchronous register, said asynchronous register including a plurality of threshold gates.

7. An addressable asynchronous register file for storing NULL convention signals, said NULL convention signals having at least a first data value signifying data and a NULL value which has no data significance, said register file comprising:

an input register receiving, storing, and propagating alternating wavefronts of NULL and data values;

a first storage register connected to receive and store data and NULL values in alternate succession from the input register and having data outputs indicating stored data and NULL values;

a second storage register connected to receive and store data and NULL values from the input register and having data outputs indicating stored data and NULL values; and an address generating circuit generating an enable signal selectively enabling one of the first and second storage registers;

wherein an enabled one of the storage registers stores data values propagated from the input register while enabled, and wherein at least one of first and second said storage registers comprise:
an asynchronous register, said asynchronous register including a plurality of threshold gates; and
an output buffer.

8. An addressable asynchronous register file for storing NULL convention signals, said NULL convention signals having at least a first data value signifying data and a NULL value which has no data significance, said register file comprising:

an input register receiving, storing, and propagating alternating wavefronts of NULL and data values;

a first storage register connected to receive and store data and NULL values in alternate succession from the input register and having data outputs indicating stored data and NULL values;

a second storage register connected to receive and store data and NULL values from the input register and having data outputs indicating stored data and NULL values; and an address generating circuit generating an enable signal selectively enabling one of the first and second storage registers;

wherein an enabled one of the storage registers stores data values propagated from the input register while enabled, wherein each storage register comprises an asynchronous register, said asynchronous register including a plurality of threshold gates and having a plurality of data outputs, and wherein each asynchronous register includes a watcher gate generating a DACK feedback signal when all register data outputs assert meaningful data values.

9. An addressable asynchronous register file for storing NULL convention signals, said NULL convention signals having at least a first data value signifying data and a NULL value which has no data significance, said register file comprising:

an input register receiving, storing, and propagating alternating wavefronts of NULL and data values;

wherein the input register:
propagates a wavefront of NULL values to an enabled storage register when the enabled storage register data outputs assert meaningful data values, and
propagates meaningful data values to an enabled storage register when the enabled storage register outputs NULL values;

a first storage register connected to receive and store data and NULL values in alternate succession from the input register and having data outputs indicating stored data and NULL values;

a second storage register connected to receive and store data and NULL values from the input register and having data outputs indicating stored data and NULL values; and an address generating circuit generating an enable signal selectively enabling one of the first and second storage registers;

wherein an enabled one of the storage registers stores data values propagated from the input register while enabled;

wherein each storage register comprises an asynchronous register, said asynchronous register including a plurality of threshold gates and having a plurality of data outputs; and wherein each asynchronous register includes a watcher gate generating a NACK feedback signal when all register data outputs assert NULL data values.

10. An addressable asynchronous register file for storing NULL convention signals, said NULL convention signals having at least a first data value signifying data and a NULL value which has no data significance, said register file comprising:

an input register receiving, storing, and propagating alternating wavefronts of NULL and data values;

wherein the input register:
propagates a wavefront of NULL values to an enabled storage register when the enabled storage register data outputs assert meaningful data values, and
propagates meaningful data values to an enabled storage register when the enabled storage register outputs NULL values;

a first storage register connected to receive and store data and NULL values in alternate succession from the input register and having data outputs indicating stored data and NULL values;

a second storage register connected to receive and store data and NULL values from the input register and having data outputs indicating stored data and NULL values; and an address generating circuit generating an enable signal selectively enabling one of the first and second storage registers;

wherein an enabled one of the storage registers stores data values propagated from the input register while enabled;

wherein each storage register comprises an asynchronous register, said asynchronous register including a plurality of threshold gates and having a plurality of data outputs; and wherein each asynchronous register includes a watcher gate generating a DACK feedback signal when all register data outputs assert meaningful data values, and generating a NACK feedback signal when all register data outputs assert NULL values.

11. A method of storing NULL convention signals in an addressed one of a plurality of storage registers, said NULL convention signals having at least a first data value signifying data and a NULL value which has no data significance, comprising steps of:

providing NULL values to an input register;

transferring NULL values from the input register to the addressed storage register;

storing NULL values in the addressed storage register;

providing meaningful data values to the input register; and transferring meaningful data values from the input register to the addressed storage register after storing NULL values in the addressed storage register.

12. The method of claim 11 wherein the step of transferring meaningful data values from the input register to the addressed storage register includes steps of:

detecting the storage of NULL values in the addressed storage register; and transferring meaningful data values from the input register to the addressed storage register after detecting the storage of NULL values in the addressed storage register.

13. The method of claim 11 wherein the step of transferring NULL values from the input register to the addressed storage register includes steps of:

detecting the storage of meaningful data values in the addressed storage register; and transferring NULL values from the input register to the addressed storage register after detecting the storage of meaningful data values in the storage register.

14. An addressable, asynchronous register file for storing NULL convention signals, each NULL convention signal having at least a first state signifying data and a NULL state which has no data significance, each NULL convention signal cycling through the NULL state between data states, a plurality of said NULL convention signals collectively cycling through alternating wavefronts of NULL and data expressions, said register file comprising:

an asynchronous input register receiving, storing, and propagating alternating wavefronts of NULL and data states of NULL convention signals;

a plurality of addressable, asynchronous storage registers, each addressably connected to receive, store and propagate alternating wavefronts of NULL and data states of NULL convention signals;

an address generating circuit generating an enable signal selectively addressing one of the plurality of addressable, asynchronous storage registers;

wherein at least one of said asynchronous input and storage registers comprises one or more threshold gates having a switching characteristic such that: (1) the gate output switches to the NULL state when all inputs become NULL, (2) the gate output switches to a meaningful state when a number of input signals in the meaningful state exceeds a threshold value.

15. The addressable, asynchronous register file of claim 14, wherein:

a binary, NULL convention signal is embodied in first and second physical conductors, each conductor capable of assuming a first state and a second state;

the first state of a physical conductor represents a NULL state for the signal;

the second state of a physical conductor represents a meaningful state for the signal; and a meaningful state of the first physical conductor signifies a first binary value;

a meaningful state of the second physical conductor signifies a second binary value;

NULL states on the first and second physical conductors signifies the NULL state of the binary, NULL convention signal.

16. An addressable asynchronous register file for storing NULL convention signals, said NULL convention signals having at least a first data value signifying data and a NULL value which has no data significance, each said signal containing sufficient information to determine the validity of said first data value, said register file comprising:

an input register receiving, storing, and propagating alternating wavefronts of NULL and data values;

a first storage register connected to receive and store data and NULL values in alternate succession from the input register and having data outputs indicating stored data and NULL values;

a second storage register connected to receive and store data and NULL values from the input register and having data outputs indicating stored data and NULL values; and an address generating circuit generating an enable signal selectively enabling one of the first and second storage registers;

wherein an enabled one of the storage registers stores data values propagated from the input register while enabled.

17. The register file of claim 16 wherein:

the input register propagates a wavefront of NULL values to an enabled storage register when the enabled storage register data outputs assert meaningful data values, and the input register propagates meaningful data values to an enabled storage register when the enabled storage register outputs NULL values.

18. The register of claim 16 wherein each storage register connects to the input register through NULL convention signal lines, at least some NULL convention signal lines comprising a plurality of electrical conductors, each electrical conductor assuming one of two voltage levels.

19. The register of claim 16 wherein each storage register connects to the input register through NULL convention signal lines, at least one NULL convention signal line comprising one electrical conductor assuming at least three voltage levels.

20. A method of storing NULL convention signals in an addressed one of a plurality of storage registers, said NULL convention signals having at least a first data value signifying data and a NULL value which has no data significance, each said signal containing sufficient information to determine the validity of said first data value comprising steps of:

providing NULL values to an input register;

transferring NULL values from the input register to the addressed storage register;

storing NULL values in the addressed storage register;

providing meaningful data values to the input register; and transferring meaningful data values from the input register to the addressed storage register after storing NULL values in the addressed storage register.

21. The method of claim 20 wherein the step of transferring meaningful data values from the input register to the addressed storage register includes steps of:

detecting the storage of NULL values in the addressed storage register; and transferring meaningful data values from the input register to the addressed storage register after detecting the storage of NULL values in the addressed storage register.

22. The method of claim 20 wherein the step of transferring NULL values from the input register to the addressed storage register includes steps of:

detecting the storage of meaningful data values in the addressed storage register; and transferring NULL values from the input register to the addressed storage register after detecting the storage of meaningful data values in the storage register.

\* \* \* \* \*